United States Patent
Rehnström et al.

(10) Patent No.: US 10,641,975 B2
(45) Date of Patent: May 5, 2020

(54) SYSTEM, METHOD, AND APPARATUS FOR OPTICAL BROADCAST TRANSMISSION IN A CIRCUIT BOARD

(71) Applicant: Telefonaktiebolaget LM Ericsson (publ), Stockholm (SE)

(72) Inventors: Mats Rehnström, Sollentuna (SE); Marie Press, Rönninge (SE); Lars Winberg, Stockholm (SE)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 0 days.

(21) Appl. No.: 15/756,690

(22) PCT Filed: Sep. 3, 2015

(86) PCT No.: PCT/SE2015/050931
§ 371 (c)(1),
(2) Date: Mar. 1, 2018

(87) PCT Pub. No.: WO2017/039508
PCT Pub. Date: Mar. 9, 2017

(65) Prior Publication Data
US 2018/0246284 A1    Aug. 30, 2018

(51) Int. Cl.
*G02B 6/42*    (2006.01)
*G02B 6/43*    (2006.01)
(Continued)

(52) U.S. Cl.
CPC ......... *G02B 6/4226* (2013.01); *G02B 6/4214* (2013.01); *G02B 6/43* (2013.01);
(Continued)

(58) Field of Classification Search
None
See application file for complete search history.

(56) References Cited

U.S. PATENT DOCUMENTS 5,500,523 A * 3/1996 Hamanaka ........... G02B 3/0006
                                                    250/216
5,696,862 A * 12/1997 Hauer .................. G02B 6/4214
                                                    385/14
(Continued)

FOREIGN PATENT DOCUMENTS

EP    0 272 027 A2    6/1988
EP    1 286 194 A2    2/2003
(Continued)

OTHER PUBLICATIONS

International Search Report and Written Opinion issued in International Application No. PCT/SE2015/050931, dated Jan. 5, 2016, 13 pages.
(Continued)

*Primary Examiner* — Tina M Wong
(74) *Attorney, Agent, or Firm* — Rothwell, Figg, Ernst & Manbeck, P.C.

(57) ABSTRACT

A multilayer PCB (160) for optical transmission is presented. The multilayer PCB includes a first layer (1510), a second layer (1520), and a transparent layer (212) between them. The transparent layer may have a first compartment (1851), which may have a first mirror (214) operable to reflect a beam of light (260B) into the first compartment of the transparent layer in a plurality of directions (260C) perpendicular to the direction of the beam of light, thereby transmitting throughout the first compartment an optical signal carried by the beam of light in said plurality of directions such that one or more other mirrors disposed in the first compartment of the transparent layer are able to receive a beam of reflected light (260C) carrying the optical signal. The multilayer PCB may further include a second mirror (1508) in the first compartment for reflecting a wave
(Continued)

of reflected light (260C) carrying the optical signal toward an optical receiver (1705).

16 Claims, 19 Drawing Sheets

(51) Int. Cl.
*H05K 1/02* (2006.01)
*H04B 10/40* (2013.01)
*H05K 1/18* (2006.01)

(52) U.S. Cl.
CPC .......... *H04B 10/40* (2013.01); *H05K 1/0274* (2013.01); *H05K 1/181* (2013.01); *H05K 2201/0108* (2013.01); *H05K 2201/10121* (2013.01)

(56) References Cited

U.S. PATENT DOCUMENTS

| | | | | |
|---|---|---|---|---|
| 5,786,925 A * | 7/1998 | Goossen | ............... | G02B 6/122 359/245 |
| 6,846,725 B2 * | 1/2005 | Nagarajan | ............... | B81B 7/007 438/456 |
| 6,912,333 B2 * | 6/2005 | Mikawa | ............... | G02B 6/43 385/14 |
| 7,373,033 B2 * | 5/2008 | Lu | ............... | G02B 6/421 257/432 |
| 7,775,669 B2 * | 8/2010 | Liao | ............... | F21V 9/08 353/31 |
| 8,055,105 B2 * | 11/2011 | Hodono | ............... | G02B 6/1221 385/14 |
| 8,559,774 B2 * | 10/2013 | Shacklette | ............... | G02B 6/3522 385/16 |
| 8,611,704 B2 * | 12/2013 | Yasuda | ............... | G02B 6/4214 385/14 |
| 8,712,198 B2 * | 4/2014 | Bicknell | ............... | G02B 6/125 385/24 |
| 8,929,693 B2 * | 1/2015 | Shin | ............... | G02B 6/12 385/123 |
| 9,057,853 B2 * | 6/2015 | Lau | ............... | G02B 6/43 |
| 2003/0142913 A1 | 7/2003 | Li | | |
| 2004/0042705 A1 * | 3/2004 | Uchida | ............... | G02B 6/43 385/14 |
| 2005/0100264 A1 * | 5/2005 | Kim | ............... | G02B 6/42 385/14 |
| 2006/0159386 A1 | 7/2006 | Iwasaki | | |
| 2007/0258676 A1 * | 11/2007 | Windover | ............... | H04B 10/801 385/14 |
| 2018/0246284 A1 * | 8/2018 | Rehnstrom | ............... | G02B 6/4214 |

FOREIGN PATENT DOCUMENTS

| | | |
|---|---|---|
| JP | H06 334212 A | 12/1994 |
| WO | 2013045498 A1 | 4/2013 |
| WO | 2017/039507 A1 | 3/2017 |

OTHER PUBLICATIONS

International Preliminary Report on Patentability issued in International Application No. PCT/SE2015/050931, dated Dec. 20, 2017, 14 pages.

* cited by examiner

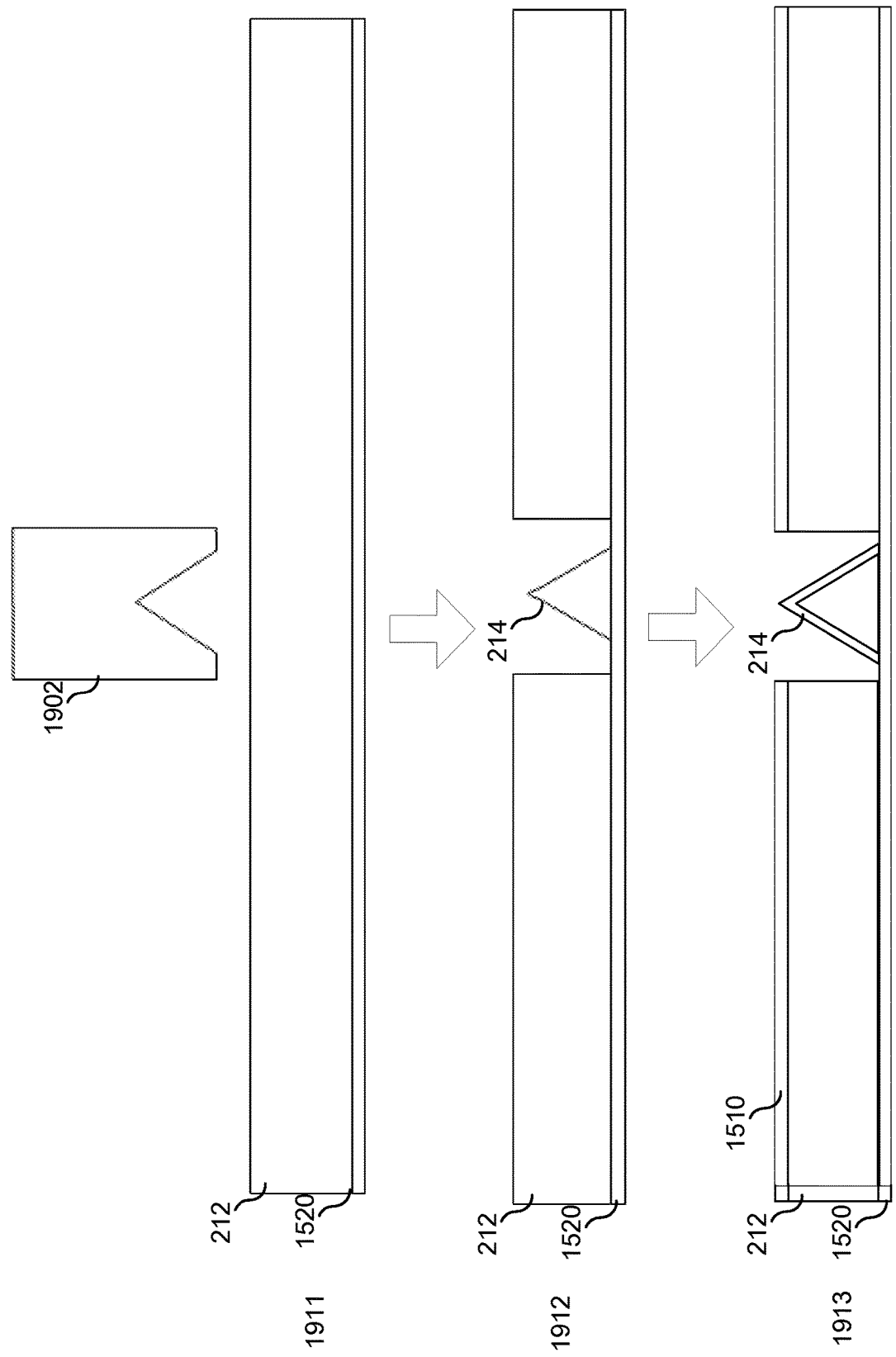

SYSTEM, METHOD, AND APPARATUS FOR OPTICAL BROADCAST TRANSMISSION IN A CIRCUIT BOARD

CROSS REFERENCE TO RELATED APPLICATION(S)

This application is a 35 U.S.C. § 371 National Stage of International Patent Application No. PCT/SE2015/050931, filed Sep. 3, 2015, designating the United States, the disclosure of which is incorporated by reference.

TECHNICAL FIELD

This disclosure relates to a system, method, and apparatus for optical broadcast transmission in a circuit board.

BACKGROUND

As more and more data is being transmitted over networks, there is a great need for higher data transmission speeds between components, including components located on the same circuit board. Copper is a common material used to transmit data, but copper suffers from transmission speed limitations. For example, a copper trace currently provides no more than 25 Gbps over at a short distance at large physical volume and at high power consumption.

To improve performance, optical signaling have been used. More specifically, optical cables on top of a printed circuit board (PCB) have been used to route optical signals between components on the PCB.

SUMMARY

The present disclosure is concerned with a providing a system for communicating optical signals between components on the same circuit board. Cables, such as optical fibers, may be placed on top of the circuit board to route such optical signals, but these cables may obstruct airflow on the board and thus negatively influence the ability to cool components on the board. Further, airflow can place mechanical strain on the cables, thus increasing the risk of defects. The cables also take up space around the board, preventing other components from being placed in the cables' immediate vicinity.

The communication of optical signaling can be enhanced by an in-board solution that embeds a transparent channel, such as a transparent layer or optical fiber, within the circuit board. The embedded optical fiber may route an optical signal from an optical transmitter to an optical receiver. The transparent layer may allow an optical signal to be broadcasted in the layer from an optical transmitter. An optical receiver may then receive the broadcasted signal. Embedding such transparent channels in the circuit board reduces or eliminates the footprint of optical fibers above the circuit board.

In some cases, the transparent layer may allow for less strict alignment requirements than with an optical fiber. For example, with the use of an optical fiber or optical waveguide, a reflector that reflects an optical signal from a transmitter into the optical fiber may have to be aligned with the, e.g., 0.009 mm-diameter circle for a single mode fiber or 0.05 mm-diameter circle for a multimode fiber that forms one end of the optical fiber. This alignment directs the optical signal into the optical fiber. With the use of a transparent layer, there may be more tolerance in the placement of the optical reflector because the optical signal does not need to be directed into an optical fiber, but is intended to be spread in all directions in the transparent layer.

If there are multiple optical transmitters above the transparent layer, they may share this transparent layer by using, e.g., a collision detection or wavelength division or frequency division scheme. In some embodiments, the transparent layer may be divided into multiple compartments, such that transmitters belonging to different compartments can broadcast optical signals using the same frequency.

Thus, the disclosure presents, among other things, a system, method, and apparatus for optical broadcast transmission in a circuit board. In one aspect, the apparatus includes a multilayer printed circuit board (PCB) that includes, e.g., a first layer, a second layer, and a transparent layer between the first layer and the second layer. The transparent layer may have a first compartment. The multilayer PCB may include a first mirror disposed in the first compartment of the transparent layer such that the first mirror is operable to reflect a beam of light into the first compartment of the transparent layer in a plurality of directions perpendicular to the direction of the beam of light, thereby transmitting throughout the first compartment of the transparent layer an optical signal carried by the beam of light in said plurality of directions such that one or more other mirrors disposed in the first compartment of the transparent layer are able to receive a beam of reflected light carrying the optical signal. The multilayer PCB may further include a second mirror disposed in the first compartment of the transparent layer for reflecting a wave of reflected light carrying the optical signal toward an optical receiver.

In some implementations, the first mirror is a cone mirror, and the second mirror is a cone mirror.

In some implementations, the first transparent layer consists of the first compartment.

In some implementations, the transparent layer further comprises a second compartment, wherein the first compartment and the second compartment are separated from each other by a non-transparent isolating structure, such that light in the first compartment cannot reach the second compartment.

In some implementations, the multilayer PCB further comprises additional cone mirrors disposed in the first compartment of the transparent layer for reflecting the wave of reflected light carrying the optical signal toward one or more optical receivers.

In some implementations, the transparent layer, at its periphery, has at least two opposing surfaces that converge toward each other so as to form an angle.

In some implementations, the periphery of the transparent layer has an internal surface that is at least partially covered by a light-absorbing material.

In some implementations, the transparent layer has at least two opposing surfaces that are coated with a light-reflective material.

In some implementations, one or more metal-plated through-holes pass through the first compartment.

In one aspect, the system for communicating optical signals comprises a first a first embedded optical transceiver system, E-OTRX, which has an optical transceiver configured to transmit a beam of light in a first direction. The system includes a second E-OTRX having an optical transceiver configured to receive light. The system further includes a multilayer printed circuit board, PCB, attached to the first E-OTRX and the second E-OTRX. The multilayer PCB has a first opening facing the first E-OTRX and a second opening facing the second E-OTRX. The multilayer PCB further comprises a first layer, a second layer, a transparent layer between the first layer and the second layer, where the transparent layer comprises a first compartment. The multilayer PCB further comprises a first mirror disposed in the first compartment of the transparent layer and in the first opening of the multilayer PCB. It further include a second mirror disposed in the first compartment of the transparent layer and in the second opening of the multilayer PCB. The first mirror is operable to reflect the beam of light into the transparent layer in a plurality of directions perpendicular to the first direction, thereby transmitting throughout the first compartment of the transparent layer an optical signal carried by the reflected beam of light such that the second cone mirror is able to reflect the reflected beam of light toward the second E-OTRX.

In some implementations, the transparent layer of the multilayer PCB further comprises a second compartment, wherein the first compartment and the second compartment are separated from each other by a non-transparent isolating structure, such that light in the first compartment cannot reach the second compartment.

In some implementations, the first optical transceiver is configured to transmit the beam of light at a first frequency, the system further comprising a third optical transceiver configured to transmit another beam of light in the first direction at a different frequency than the first frequency.

In some implementations, the multilayer PCB further comprises a third mirror operable to reflect the other beam of light from the third optical transceiver.

In some implementations, the system further comprises a plurality of actuators that are configured to move the optical transceiver of the first E-OTRX relative to the first cone mirror.

In some implementations, the system further comprises another plurality of actuators that are configured to move the first cone mirror relative to the optical transceiver of the first E-OTRX.

In some implementations, the first E-OTRX further comprises a beam expander configured to expand a beam of light being transmitted by the optical transceiver of the first E-OTRX and a housing that houses the optical transceiver and the beam expander.

In some implementations, each of the first mirror and the second mirror is a cone mirror.

In some implementations, the second E-OTRX further comprises a lens system configured to narrow a beam of light and to pass the narrowed beam of light to the optical transceiver of the second E-OTRX, and a housing that houses the optical transceiver and lens system.

These and other aspects and embodiments are further described herein.

BRIEF DESCRIPTION OF THE DRAWINGS

FIG. 19 illustrates an example process for manufacturing the transparent layer and optical reflector.

DETAILED DESCRIPTION

Figure 1A:
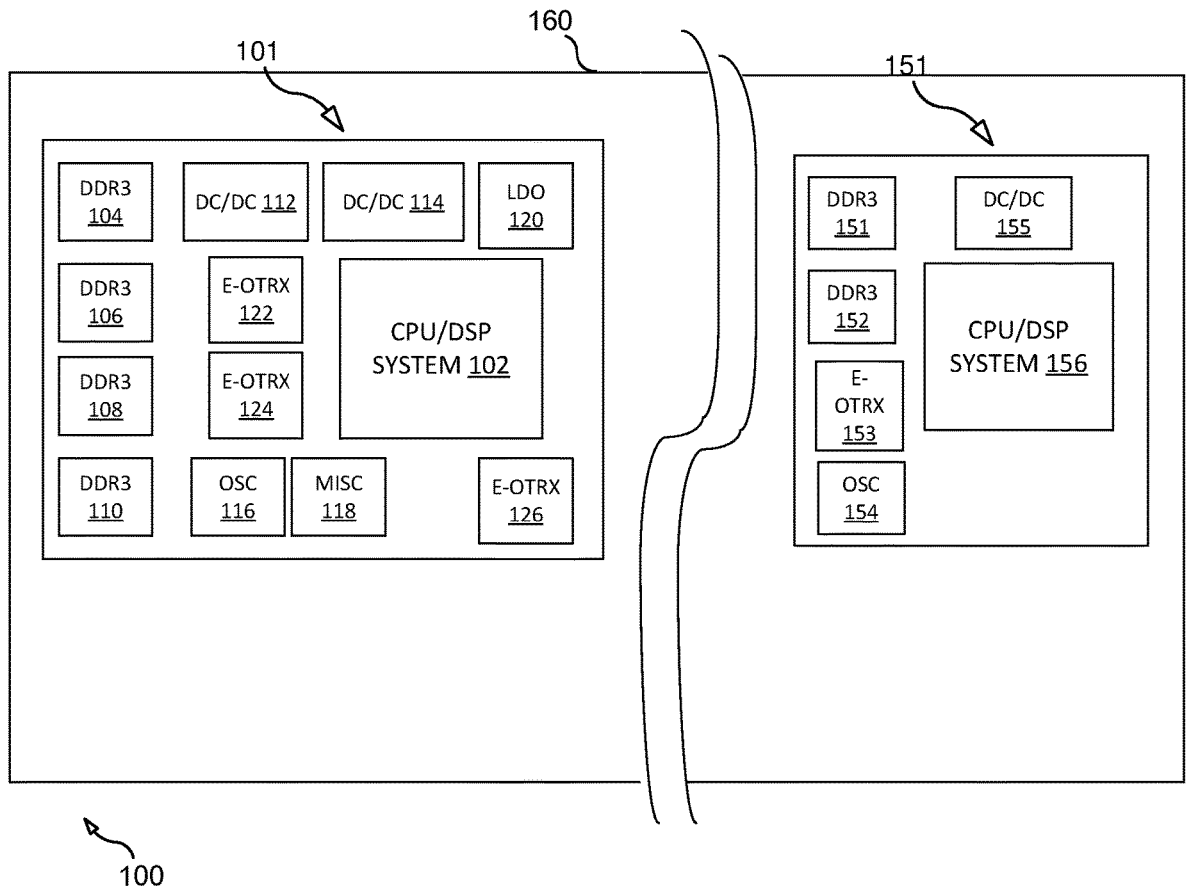
FIGS. 1A-1B illustrate a circuit board having multi-chip modules (MCMs) that communicate with each other using embedded optical transceiver systems (E-OTRXs).
Figure 1B:
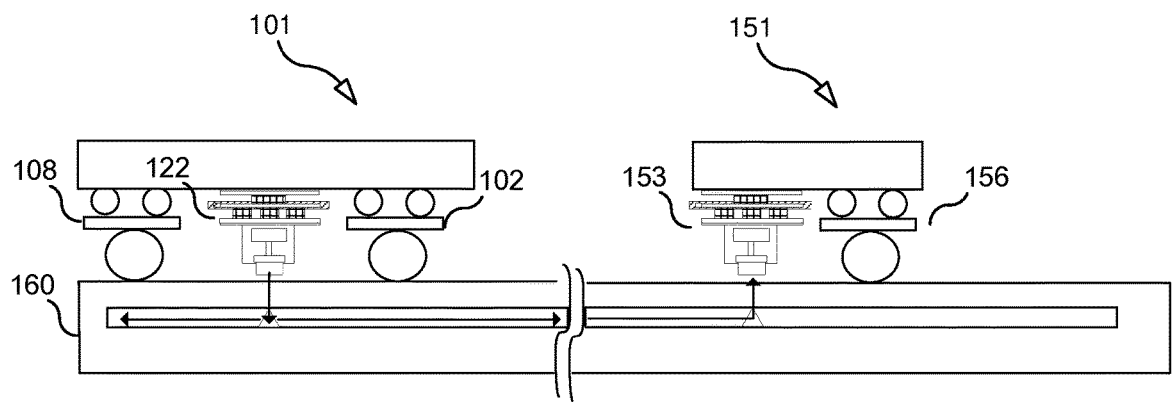

FIGS. 1A and 1B illustrate a floor plan view and side view, respectively, of an example system 100 that provides optical signaling for communication among various components. The system 100 includes a circuit board 160 (e.g., a printed circuit board (PCB)), which may be a multi-layer circuit board that has an optical layer 212 (see FIG. 2) for broadcasting or otherwise propagating the optical signals (e.g., a waveguide embedded in the circuit board). Various components may be mounted on circuit board 160. Examples of such components include a multi-chip module (MCM) 101 and a MCM 151. In an embodiment, a MCM may be shaped as an integrated circuit (IC), preferably but not necessarily a ball grid array (BGA) package that may be soldered onto a circuit board. In an embodiment, a MCM may be mounted on a circuit board via flip chip technology or bare-die technology, which may miniaturize and save space and routing. MCM 101 may include components such as a CPU/DSP (or ASIC) 102, memory components (e.g., DDR3 chips 104, 106, 108, and 110, or other forms of memory such as SRAM, EPROM, EEPROM, FLASH, DDR2, DDR4, FRAM), DC/DC voltage converters (e.g., DC/DC converters 112 and 114), an oscillator 116, a low dropout (LDO) regulator 120, and embedded optical transceiver systems (E-OTRXs) 122, 124, and 126 mounted on a carrier substrate of the MCM (e.g., another circuit board). MCM 151 may include components such as a CPU/DSP 156, a memory component (e.g., DDR chips 151, 152), a DC/DC voltage converter 155, an oscillator 154, and an E-OTRX 153. The E-OTRXs allow MCM 101 and MCM 151 to communicate with each other using optical signaling in a transparent layer of the circuit board 160, as a supplement or alternative to communication through copper traces of the board 160.

In an embodiment, each of the E-OTRXs 122, 124, 126, and 153 may be configured to convert an electrical signal to an optical signal (e.g., convert data from an electrical form to an optical form), and/or vice versa. FIG. 1B illustrates an example in which E-OTRX 122 converts data generated by, e.g., CPU/DSP 102, from an electrical signal to an optical signal and broadcasts the optical signal, through a transparent layer in circuit board 160, toward another E-OTRX 153 of another MCM 151. The E-OTRX 153 in that MCM 151 may convert the optical signal to an electrical signal, which may be relayed (with or without further processing) to CPU/DSP 156. In an embodiment, an E-OTRX includes an internal controller. In an embodiment, any controller of the E-OTRX is external to the E-OTRX, and controls the E-OTRX through one or more power lines and one or more control lines. For instance, CPU/DSP 102 may be responsible for controlling movement in the E-OTRX. The one or more control lines may control actuation of the E-OTRXs, as discussed below. The one or more power lines may power the actuation of the E-OTRXs, provide power to create optical signals to be broadcasted, relay or amplify electrical signals converted from received optical signals, or any combination thereof.

Figure 2:
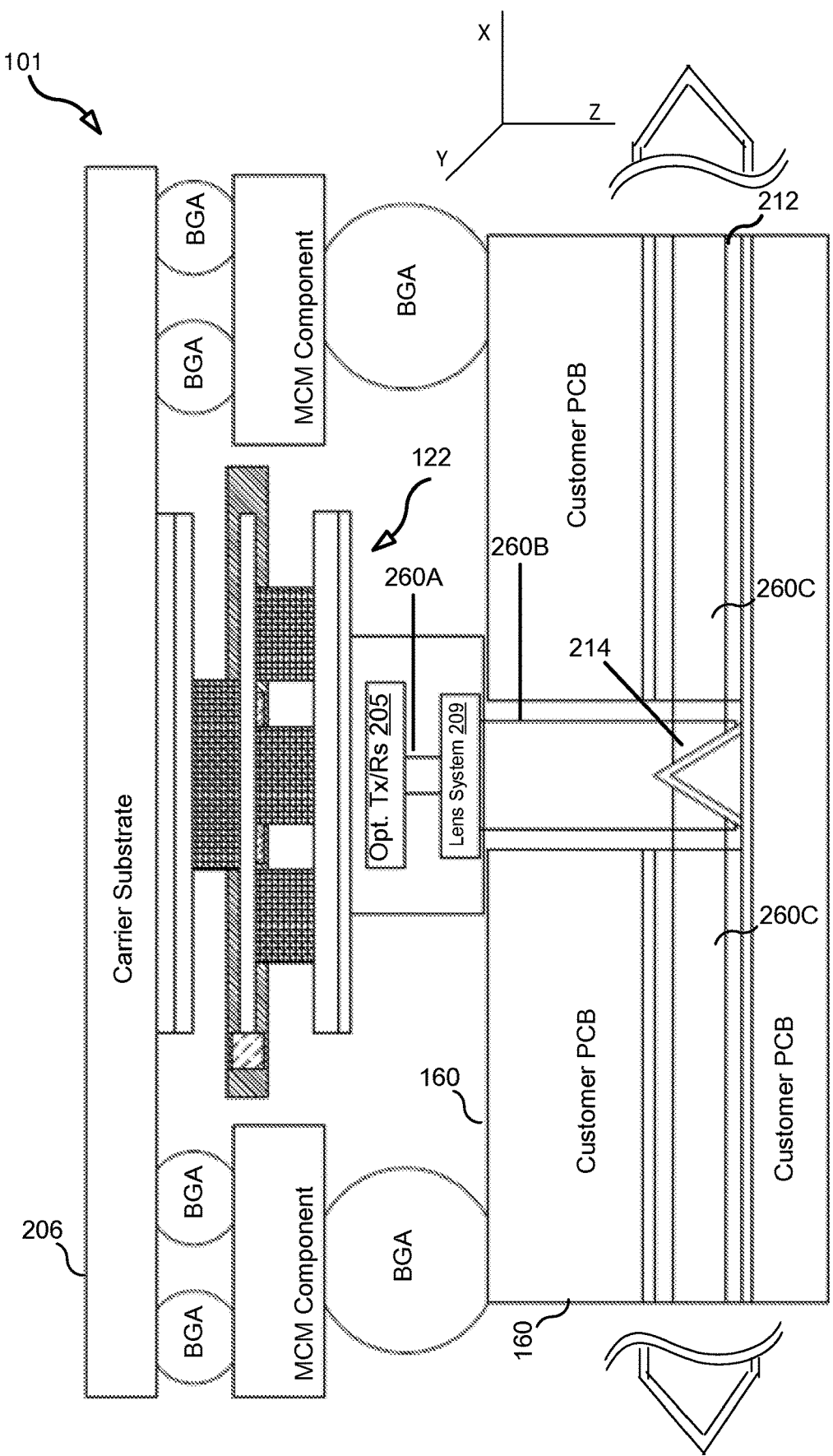
FIG. 2 illustrates a side view of a E-OTRX on a MCM mounted on a circuit board having an embedded optical reflector and an optical signal routing layer.

FIG. 2 illustrates a more detailed cross-sectional view of MCM 101, including E-OTRX 122, and circuit board 160, according to some embodiments. In this example, the circuit board 160 includes a transparent layer 212, which allows an optical pulse 260C to spread outward (e.g., as an omnidirectional wave) from the optical reflector 214 or which allows other pulses to propagate toward optical reflector 214. In some cases, the reflector 214 may be a cone- or prism-shaped mirror embedded in a hole (e.g., a circular hole) in the circuit board 160. The reflector 214 may both reflect an optical signal (e.g., optical pulse 260A or optical pulse 260B) from the E-OTRX 122 into the transparent layer 212, or reflect an optical signal from another component (e.g., optical pulse 260C) and reflect it toward the E-OTRX 122. In FIG. 2, optical pulse 260B is formed from optical pulse 260A using a lens system 209 (e.g., a beam expander) for cone adaptation.

The E-OTRX 122 itself may include an optical transceiver (Opt. Tx/Rx) 205 in a housing 203 and components for positioning the optical transceiver 205. Circuitry for controlling such components may be internal to E-OTRX 122, or may be external to E-OTRX 122. Data in the form of electrical signals may be communicated to or from other chips of the multi-chip module (MCM) 101, such as CPU 102 or DDR chip 103, which may each be mounted on a MCM component substrate. The optical transceiver 205 of the E-OTRX 122 is configured to convert electrical data (e.g., data from CPU/DSP/ASIC 102) into optical signals and/or receive optical signals from, for example, E-OTRX 153 and convert it to electrical data. The optical signals refer to wireless electromagnetic signals having a frequency or frequencies (or wavelength or wavelengths) in the infrared, near visible light, visible light (e.g., laser), ultraviolet, or other part of the electromagnetic spectrum. The electrical signals may be carried by wiring that extends from optical transceiver 205 to the E-OTRX 122's carrier substrate 206, which may carry the electrical signals to, e.g., an amplifier that passes the amplified electrical signals to a MCM component such as CPU 102. The carrier substrate 206 of the E-OTRX may further relay control signals for controlling position of the optical transceiver 205. The optical transceiver 205 may include one or more of an optical transmitter and an optical receiver. The controlling of the position of an optical transceiver and of an optical reflector is described in more detail below, and in co-pending application PCT/SE2015/050930, entitled "System, Method, and Apparatus for Performing Alignment Between an Optical Transceiver and an Optical Reflector." In an embodiment, the carrier substrate 206 is a circuit board, and may mount all or a subset of the components of MCM 101.

The optical transceiver 205 may be positioned to align it with reflector 214. For instance, the reflector 214 may be off-center relative to the transceiver 122, may have been mounted at an angle that deviates from the Z-axis shown in the figure, or the transceiver 205 may have been mounted at an angle that deviates from the Z-axis in FIG. 2. If the transceiver 205 is transmitting a signal such as pulse 260B, this mis-alignment may cause the optical pulse to enter the transparent layer 212 at a sub-optimal angle (e.g., cause pulse 260B to be not perpendicular to the top surface of layer 212), which may cause signal attenuation. If the transceiver 205 is attempting to receive an optical signal such as pulse 260C, this mis-alignment may cause the pulse 260C to reflect toward the transceiver 205 at a sub-optimal angle. The sub-optimal angle may cause, for instance, part of the pulse to miss the transceiver, or to otherwise be a weaker signal.

FIG. 2 presents one example of an E-OTRX 122 that is an apparatus which can adjust the position of the optical transceiver 205 relative to the reflector 214. This adjustment may include moving the optical transceiver along any of the X, Y, and/or Z axes, or by tilting the optical transceiver so that it can direct an optical pulse (e.g., pulse 260B) toward reflector 214 at the proper angle or to face an optical pulse from the optical reflector 214 (e.g., pulse 260B) at the proper angle. The adjustment provides an active way to overcome variations in manufacturing, environmental conditions, or other factors that may cause mis-alignment between the optical transceiver and a routing component such as the reflector 214.

Figure 3:
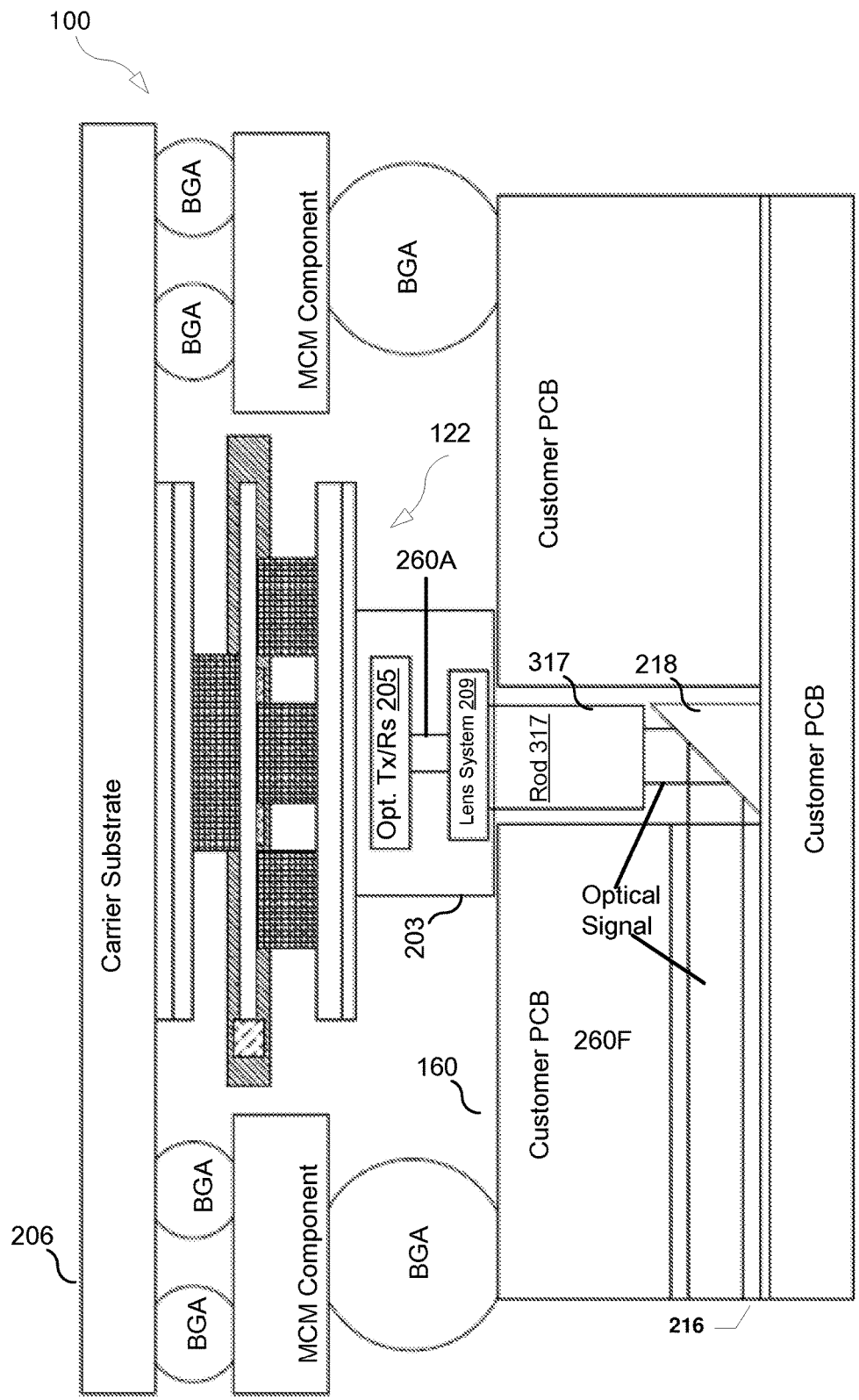
FIG. 3 illustrates a side view of a E-OTRX on a MCM mounted on a circuit board having an embedded optical reflector and optical fiber.

In the example illustrated in FIG. 2, the transparent layer 212 may take the form of a rectangular layer. FIG. 3 illustrates an example in which an optical fiber 216 is embedded in circuit board 160. The optical fiber 216 may route optical signals to or from a reflector 218 (e.g., a prism-shaped mirror). FIG. 3 also illustrates that a rod 317 may be used to further guide an optical signal between the optical transceiver 205 and the reflector 218. The rod may be formed by a piece of optical fiber (e.g., a fiber 0.5 mm or 1 mm in diameter) attached to the housing of the optical transceiver 205. In another example, the transparent layer may have a triangular shape, square shape, any other polygonal shape, a rounded shape, any other shape, or any combination thereof.

In some cases, using the transparent layer 212 may allow for less strict alignment requirements than with an optical fiber 216. For example, with the use of an optical fiber 216, the prism 218 may have to be aligned with, e.g., the 0.009 mm-, 0.5 mm- or 0.25 mm-diameter circle that forms one end of the optical fiber. With the use of a transparent layer 212, there may be more tolerance in the placement of the cone mirror 214 because the optical signal does not need to be directed into an optical fiber, but is instead intended to be spread in a plurality of directions (e.g., all directions) in the transparent layer.

Figure 15:
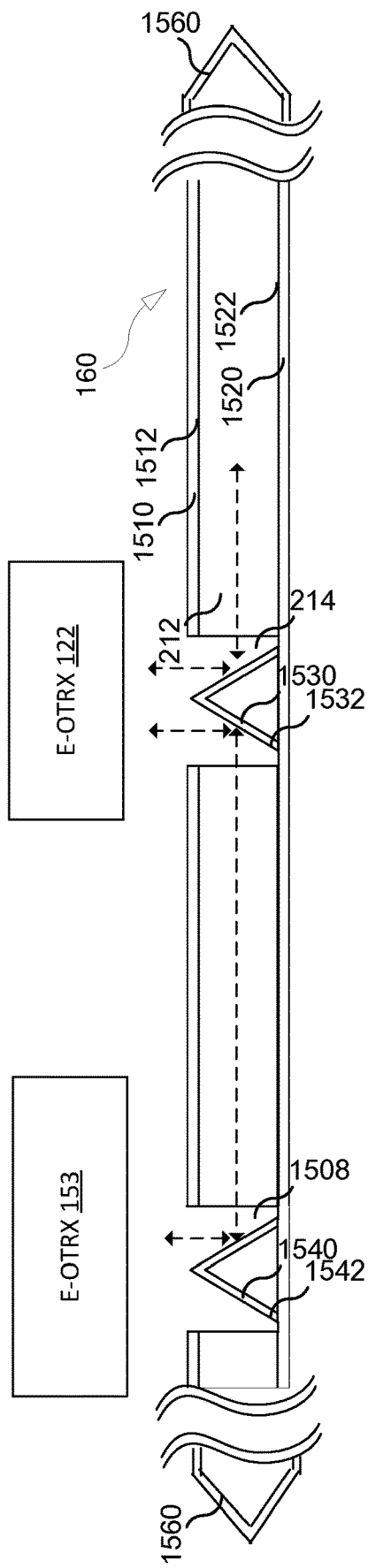
FIG. 15 illustrates a circuit board having a transparent layer for propagation of an optical signal.

A more detailed example of the circuit board 160 having a transparent layer 212 for the propagation of optical signals is presented in FIG. 15. The figure illustrates a cross section of a circuit board 160 that has a transparent layer 212 between a first layer 1510 and a second layer 1520. Each of the first layer 1510 and the second layer 1520 may be an electrical layer, and the transparent layer 212 may be a transparent optical layer. The transparent layer 212 allows an optical transceiver 205 in, e.g., E-OTRX 122 to communicate with an optical transceiver in, e.g., E-OTRX 153 of another multi-chip module (MCM). The transparent layer 212 may comprise, for example, silica or other types of glass, sapphire that is transparent to infrared light, transparent plastic, air, or any other material that is transparent to an optical signal (e.g., a signal in the infrared, visible light, or ultraviolet spectrum). In some cases, there is no air in the transparent layer 212. In an embodiment, several transparent optical layers may be applied, and three or more electrical layers may be applied.

The first layer 1510 may have a reflective surface 1512, and the second layer 1520 may have a reflective surface 1522. This may result in a transparent layer 212 which has at least two opposing surfaces coated with a light-reflective material. In an embodiment, the reflective surfaces 1510 and 1522 may be coated with a metal such as silver or aluminum, and may form a mirror-like surface. In an embodiment, one or both of layers 1510 and 1520 may comprise a pre-impregnated composite fiber material (pre-preg), such as epoxy.

The circuit board 160 further includes a first reflector 214, such as a cone mirror, and a second reflector 1508, such as another cone mirror. Shaping a mirror as a cone allows it to reflect an incident beam of light into the transparent layer 212, in a plurality of directions (e.g., in all directions) perpendicular to the direction of the beam of light, thereby effectively transmitting (e.g., broadcasting) the reflected light into the transparent layer 212. In another embodiment, however, the reflectors 214 and 1508 may have other shapes, such as a pyramidal shape or a prism shape. Reflector 214 may include a layer 1530 that has a reflective surface 1532. Similarly, reflector 1508 may include a layer 1540 that has a reflective surface 1542.

In an embodiment, the transparent layer 212 at its periphery does not have two parallel opposing surfaces, but instead has two opposing surfaces that converge toward each other so as to form an angle. In other words, the thickness of the transparent layer 212 at its periphery may decrease toward zero. In some cases, the periphery of the transparent layer 212 (or the periphery of a compartment of the transparent layer 212) may have an internal surface 1560 that is at least partially covered by a light-absorbing material. The above features facilitate the absorption of an optical signal at the periphery of the transparent layer 212. This absorption reduces the reflection of an optical signal from the periphery back into layer 212, which can create interference (e.g., destructive interference) with an incident wave in the layer 212. In another embodiment, surface 1560 may be a reflective surface.

While FIG. 15 shows layers 1510, 212, and 1520, the circuit board 160 may have additional layers above layer 1510 and/or additional layers below layer 1520.

Figure 16A:
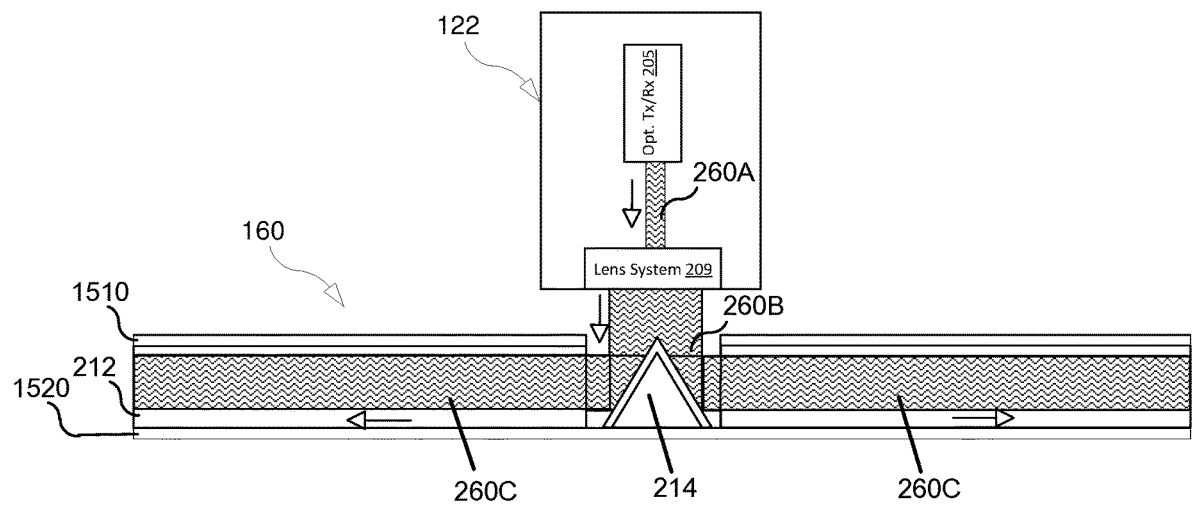
FIGS. 16A-16B illustrate broadcasting of an optical signal in a transparent layer.
Figure 16B:
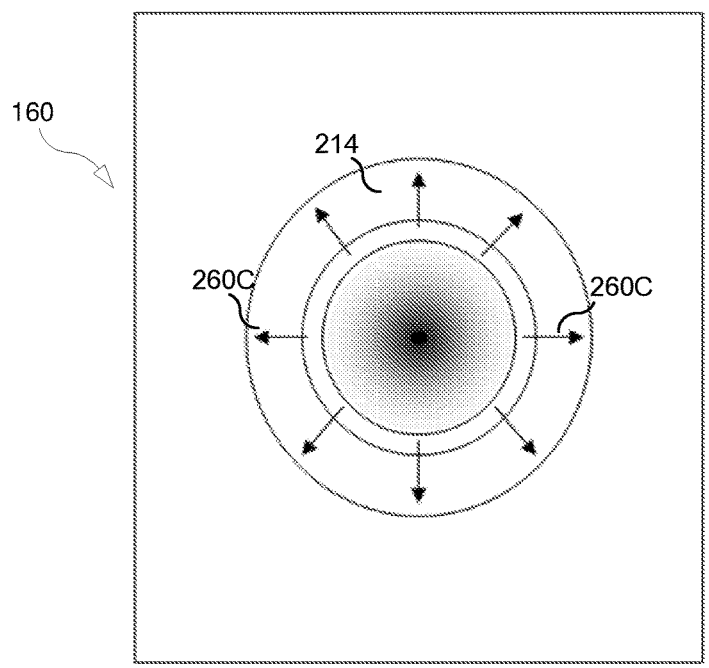

FIGS. 16A-16B illustrate an example in which a transceiver 205 is configured to output an optical signal and to use the transparent layer 212 to broadcast the optical signal. FIG. 16A shows a cross-sectional view in which the transceiver 205 transmits an optical signal as an optical beam 260A. A lens system 209 converts beam 260A to beam 260B. When the beam 260B is incident upon optical reflector 214, which may be a cone mirror, the reflector 214 may reflect the beam into an optical pulse 260C that travels in a plurality of directions (e.g., all directions) orthogonal to the direction of the beam. As the plan view in FIG. 16B illustrates, the optical pulse 260C may be omnidirectional (e.g., spreading in 360 degrees). Thus, the reflector 214 may transmit (e.g., broadcast) an optical signal in a plurality of directions in the transparent layer 212.

Figure 17A:
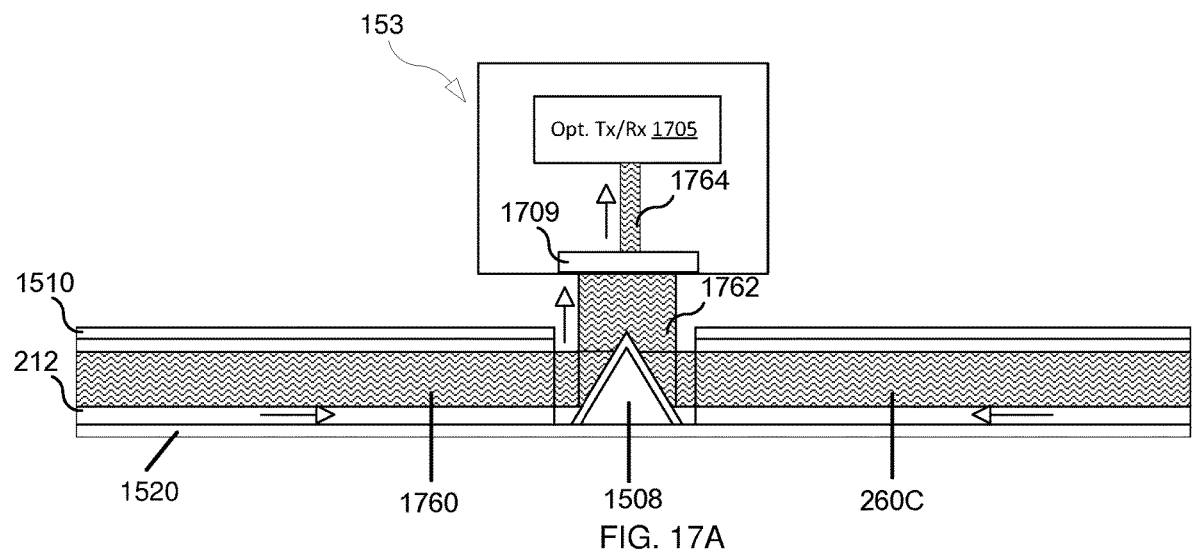
FIGS. 17A-17B illustrate reception of an optical signal via a transparent layer.
Figure 17B:
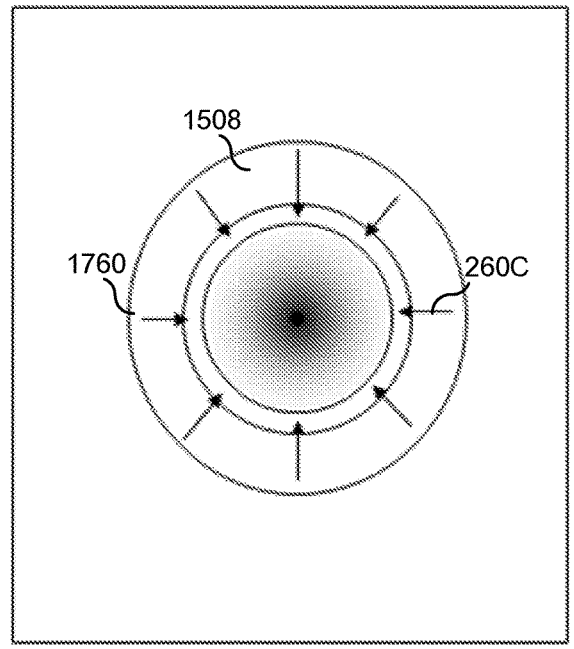

FIGS. 17A-17B illustrate an example in which a transceiver 1705 (belonging to, e.g., E-OTRX 153) is configured to receive an optical signal from transparent layer 212. In this example, the transparent layer 212 may have more than one optical pulse propagating in the layer, such as an optical pulse 1760 having a first wavelength, and the optical pulse 260C, which may have a second wavelength. When either pulse is incident on optical reflector 1508, it may be reflected toward transceiver 1705 as, e.g., beam 1762. A lens system 1709 (e.g., a beam narrowing lens system) may narrow the reflected beam 1762 into beam 1764, which may be detected at transceiver 1705. If the signals from optical pulse 1760 and optical pulse 260C mix because the pulses were incident on reflector 1508 at substantially the same time, the transceiver 1705 may be configured to filter out either the first wavelength or the second wavelength.

The transparent layer 212 may, in one embodiment, be a flat, rectangular-shaped channel through which an optical signal can be broadcasted. As an alternative or a supplement to this transparent channel, a circuit board 160 can also embed a circular transparent channel such as an optical fiber 216 (see FIG. 3). The optical fiber 216 may act as a waveguide that routes an optical signal from a transmitter to a receiver.

Figure 18:
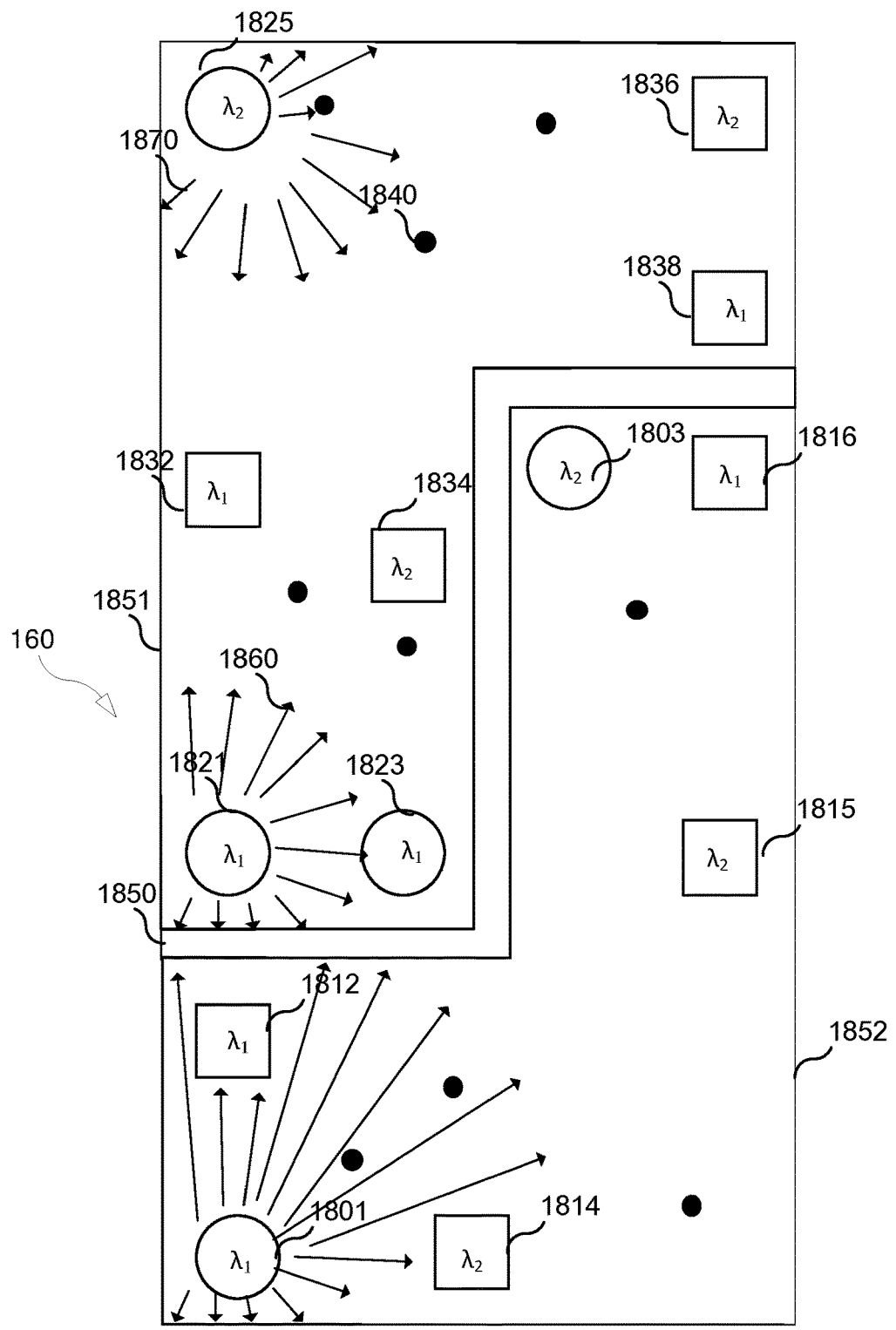
FIG. 18 illustrates two compartments of a transparent layer.

FIG. 18 illustrates an embodiment in which transparent layer 212 has a first compartment 1851 and a second compartment 1852. The two compartments may be optically isolated from each other by an isolating structure 1850, which may for example be a deposited material that absorbs light. This isolation allows two transmitters in two different compartments to use the same wavelength for their optical signals. The isolating structure 1850 prevents the two signals from interfering with each other. In some embodiments, the transparent layer 212 may consist of the first compartment 1851, such that the first compartment 1851 constitutes the transparent layer 212.

In FIG. 18, optical transmitters are depicted as circles, and optical receivers are depicted as squares. Transmitters 1821, 1823, 1825 and receivers 1832, 1834, 1836, 1838 are located over the first compartment 1851. Transmitters 1801, 1803, and receivers 1812, 1814, 1815, and 1816 are located over the second compartment 1852. Vias 1840 may pass through each compartment. Each via 1840 may be, for example, a copper plated through-hole that passes electrical signals or power from a layer above transparent layer 212 to a layer below transparent layer 212. In an embodiment, a circuit board may include one or more transparent layers in addition to transparent layer 212, and the via 1840 may be a through-hole which passes an optical signal to the one or more additional transparent layers. For instance, this "optical via" may be a light path for a E-OTRX to transmit to a reflector (e.g., a cone mirror or triangular- or trapezoidal-shaped reflector) in a transparent layer, or may be an internal via (e.g., a buried via) which is a light path between two reflectors embedded in two different transparent layers separated by other layers (e.g., separated by transparent layer 212).

The broadcast of optical signals in either compartment may be regulated based on a time division scheme (e.g., an Ethernet style collision detection mechanism), a frequency division scheme, or a combination thereof. For instance, transmitter 1821 may be configured to transmit (e.g., broadcast) an optical signal (e.g., optical signal 1860) for receiver 1832 at a first wavelength $\lambda_1$ in the transparent layer 212, and transmitter 1823 may also be configured to broadcast an optical signal for receiver 1832 at the same first wavelength $\lambda_1$. To avoid interference at receiver 1832, the two transmitters 1821, 1823 may take turns transmitting (e.g., broadcasting) an optical signal, such that only one of the two transmitters is transmitting during a time period in the us/ns/ps range. Transmitter 1870, on the other hand, may be able to transmit an optical signal (e.g., optical signal 1870) at the same time as optical transmitters 1821 and 1823, because transmitter 1870 transmits at a different wavelength $\lambda_2$. Optical receiver 1832 may be tuned to wavelength $\lambda_1$ and configured to filter out signals that are not in a range around wavelength $\lambda_1$, and optical receiver 1834 may be tuned to wavelength $\lambda_2$ and configured to filter out signals that are not in a range around wavelength $\lambda_2$. The compartments in the transparent layer are not limited to the number and shapes illustrated in FIG. 18. A transparent layer may have more (e.g., three, four, five) or fewer (i.e., one) compartment. Each compartment may have any shape, such as a rectangle, square, triangle, L-shape, or any other shape.

FIG. 19 illustrates a process by which the transparent layer 212 and optical reflector 214 may be manufactured. As shown in cross-section 1911, a transparent layer 212 may be deposited on a layer 1520, such as on a pre-preg epoxy layer. A punch 1902 may then be pressed into transparent layer 212. The punch may be a press tool similar to that used in CD or DVD production. The punch then forms a cone, as shown in view 1912. A layer 1510, such as a layer of reflective material, may then be placed above layers 212 and the cone of reflector 214.

As discussed above, the reflector (e.g., reflector 214 or reflector 218) may need to be properly aligned with transceiver (e.g., transceiver 205) to avoid signal degradation in the transparent layer 212 or poor signal detection at the transceiver. In an embodiment, the transceiver may be able to change its position to achieve proper alignment. In an embodiment, the reflector may be able to change its position to achieve proper alignment. In an embodiment, both the transceiver and the reflector may be able to change their respective positions to achieve proper alignment.

Figure 4:
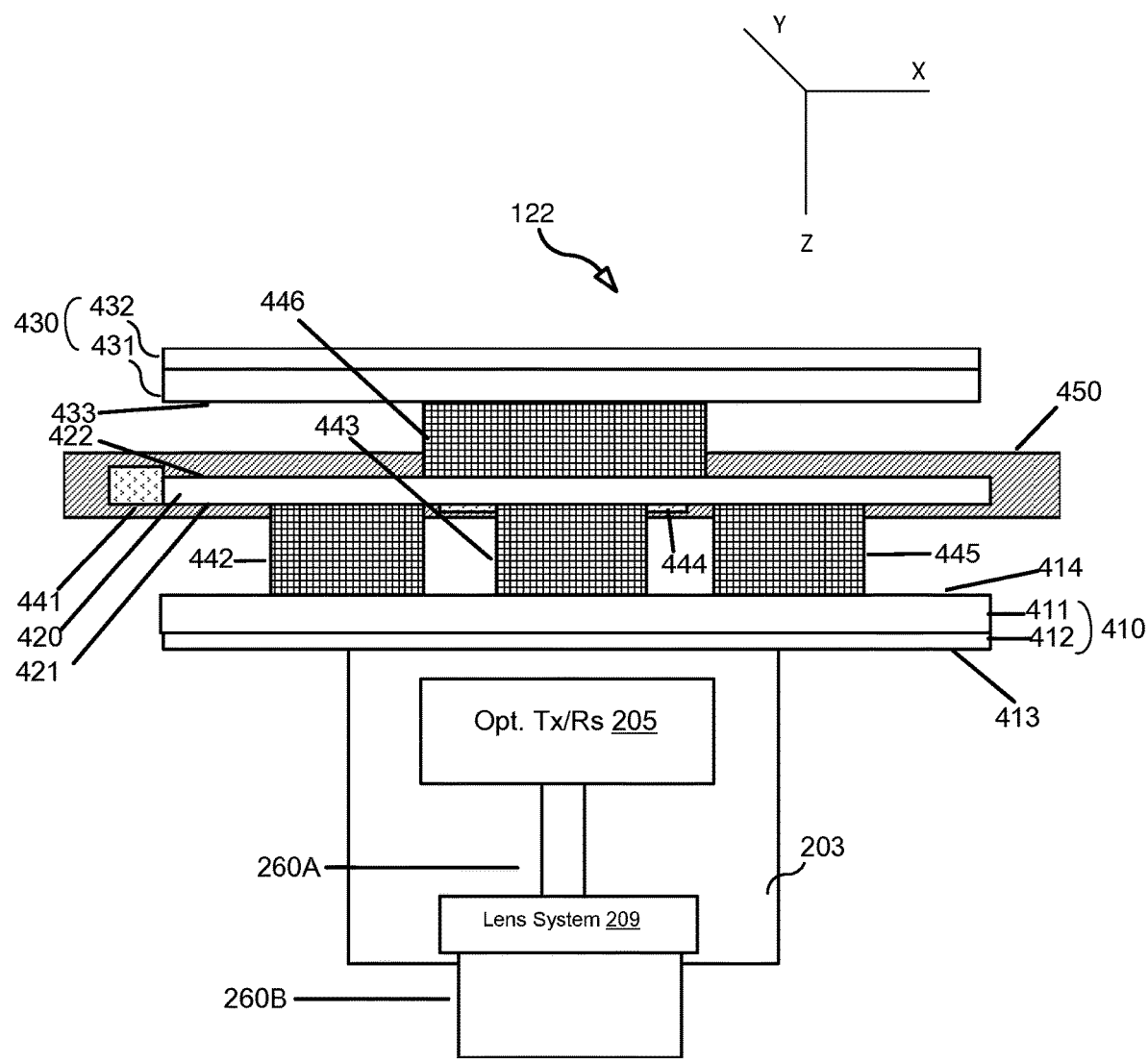
FIG. 4 illustrates a side view of components within the E-OTRX for positioning an optical transceiver relative.

Returning to FIG. 4, the figure illustrates a side view of the components of an apparatus, e.g. E-OTRX 122, for positioning optical transceiver 205 relative to a reflector embedded in a circuit board. The E-OTRX 122 includes the optical transceiver 205, a housing 203 in which the optical transceiver 205 is located, a first platform 410, a second platform 420, a third platform 430, and a frame 450. The E-OTRX 122 further includes a first set of actuators that includes actuators 442, 443, 445. E-OTRX 122 may include additional actuators, such as actuators 441, 444, and 446. In FIG. 4, actuator 444 is partially obstructed from view by actuators 443 and 446, and by the second platform 420. In general, actuators 442, 443, and 445 function to move platform 410, thereby moving housing 203 and the optical transceiver 205 within housing 203. In an embodiment, the actuators may be operable to move the optical transceiver 205 along the X, Y, and Z axes shown in FIG. 4, as well as be operable to tilt the optical transceiver 205.

In an embodiment, the housing 203 that houses the transceiver 205 is mounted on a first side 413 of the platform 410, while actuators 442, 443, and 445 are connected to a second, opposite side 414 of the first platform 410. The actuators 442, 443, and 445 in this embodiment are also connected to a first side 421 of the second platform 420. The first platform and the second platform thus may be connected through the actuators 442, 443, and 445, which are operable to move the first platform 410 relative to the second platform 420. The platforms may be completely rigid or have a degree of flexibility.

Actuators 442, 443, and 445 may each be operable to move along the Z-axis shown in the figure, which is orthogonal to a plane in which lies side 421 of second platform 420. The actuators 442, 443, and 445 may all move the same distance, or may move by different distances along the Z-axis. If the actuators 442, 443, and 445 move by different distances, they may tilt the first platform 410 relative to the second platform 420, which in turn tilts the housing 203 and the optical transceiver 205.

In an embodiment, the platform 420 may be connected to a third platform 430 through actuator 446. More particularly, actuator 446 may be connected to a second surface 422 of the second platform 420 and a first surface 433 of the third platform 430. In some cases, the third platform 430 may be mounted on a carrier substrate such as a printed circuit board (PCB), which may include or mount a control circuit that passes control signals to actuators of the E-OTRX 122. The actuator 446 may be operable to move the second platform 420 relative to the third platform 430 along the Z-axis. In some cases, a control circuit may rely on actuator 446 for motion along the Z-axis, and rely on actuators 442, 443, and 445 primarily for tilting motion. The actuators shown in this application may all have the same size, or may have different sizes. For example, the actuator 446 may have a bigger size than each of actuators 442, 443, and 445 such that it can cause more displacement along the Z-axis than each of those actuators. The actuators 442, 443, and 445 may be smaller in size in applications where the amount of tilting that is needed is limited in degree.

Figure 5:
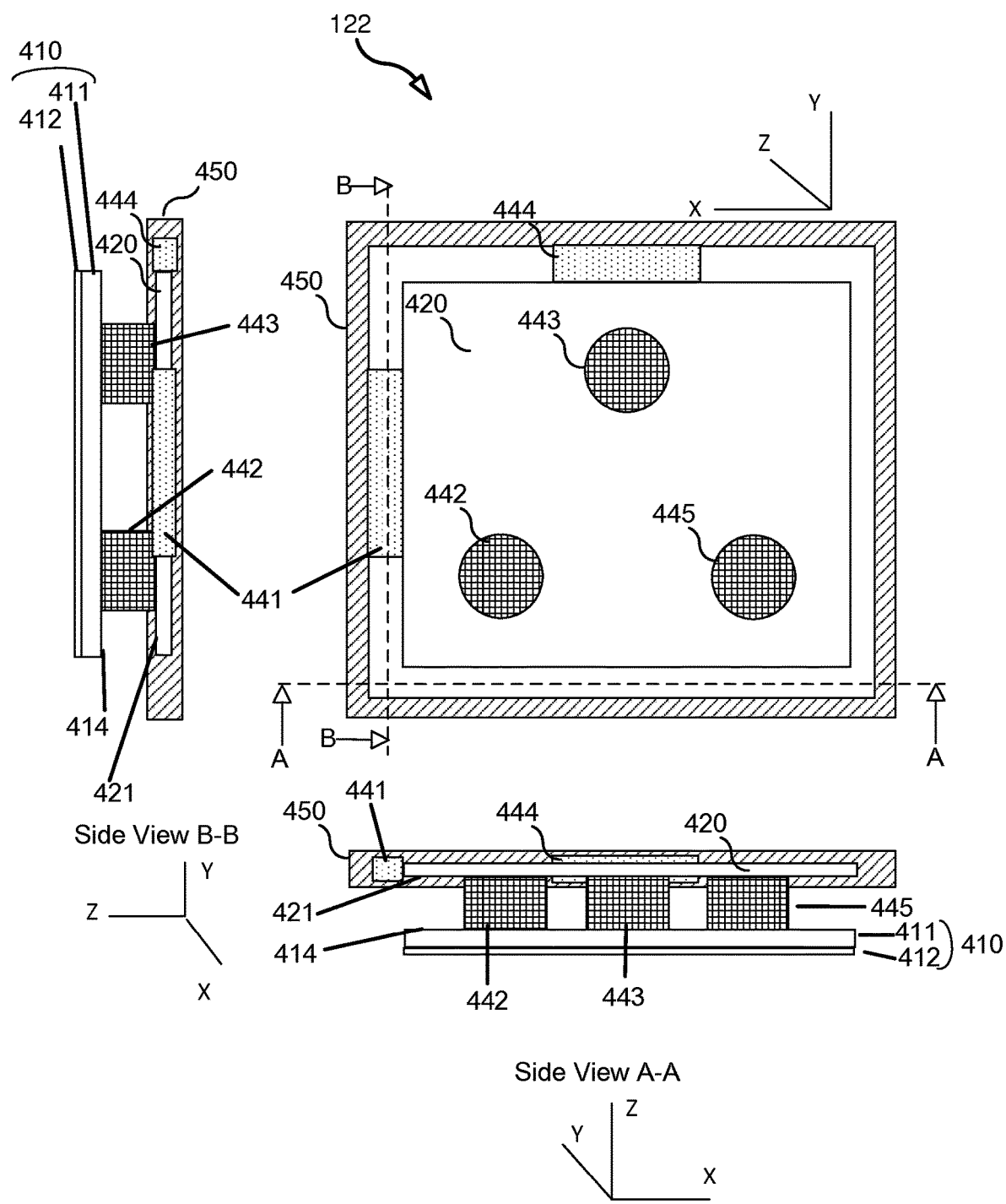
FIGS. 5 and 6 illustrate a plan view and side views of components within the E-OTRX for positioning an optical transceiver.
Figure 6:
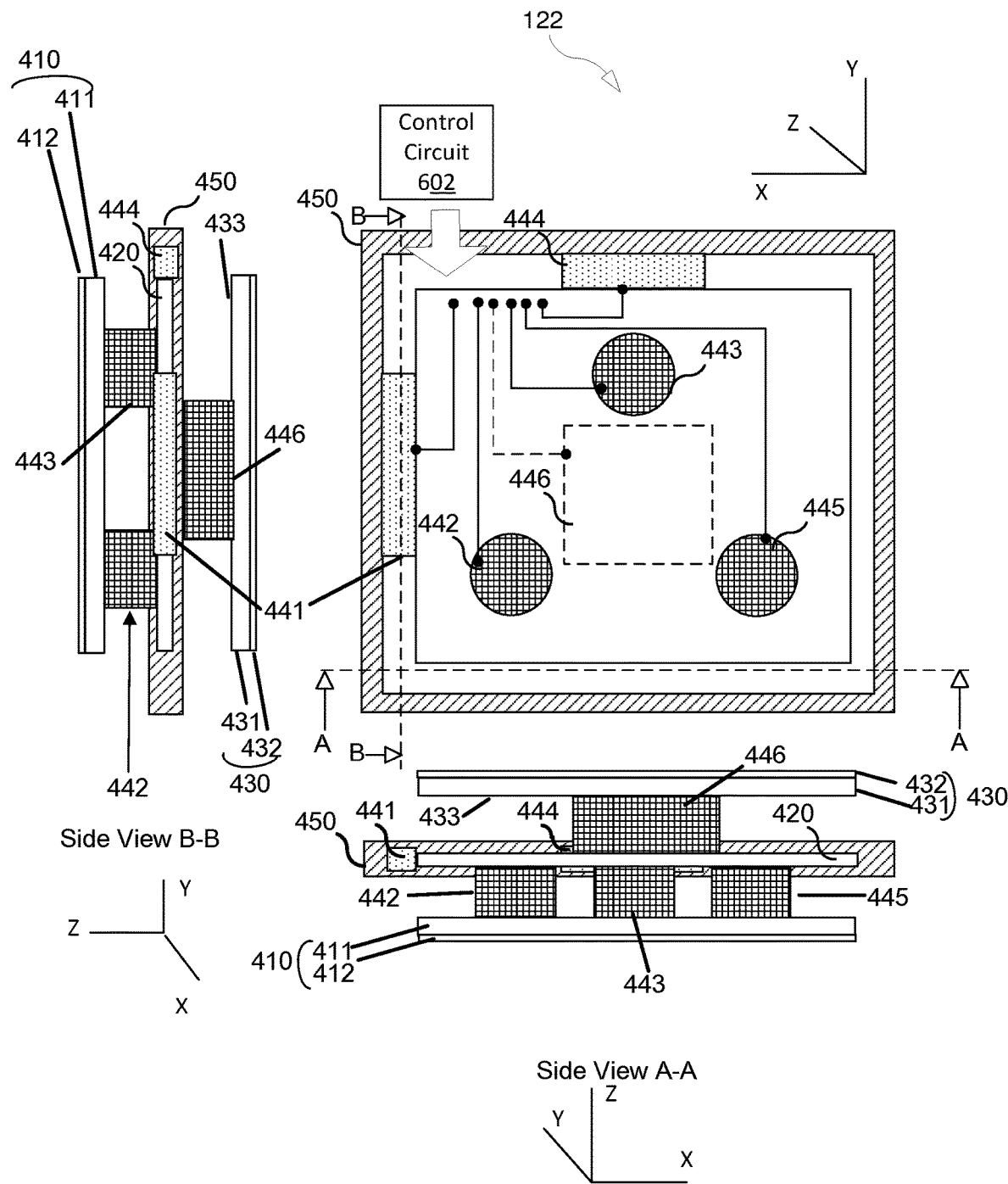

FIGS. 5 and 6 further illustrate plan views and side views of the actuators and platforms. The plan views do not include the first platform 410. FIG. 5 illustrates an embodiment of the E-OTRX 122 that relies on only actuators 442, 443, and 445 for movement along the Z-axis, and that does not include another actuator that moves along the Z-axis or that otherwise moves the second platform 420 along the Z-axis, such as actuator 446. In such an embodiment, the frame 450 may be directly connected to a circuit board or other substrate, and the E-OTRX 122 may lack a third platform (such as platform 430). FIG. 6, on the other hand, illustrates an embodiment of E-OTRX 122 that includes the actuators 442, 443, and 445, as well as actuator 446 that moves the second platform 420 relative to the third platform 430.

As both FIGS. 5 and 6 show, actuators 441 and 444 may be attached to a frame 450 and be operable to displace the second platform 420 along axes parallel to the second platform 420, which may both be axes orthogonal to the Z-axis. For instance, actuator 441 may be operable to displace the second platform 420 along the X-axis, and actuator 444 may be operable to displace the second platform 420 along the Y-axis. In an embodiment, either of or both actuators 441 and 444 may be connected to platform 420. For instance, actuator 444 may be connected to the second platform 420. In that instance, if actuator 441 displaced the second platform 420 along the X-axis, actuator 444 may be operable to stretch or shrink along the X-axis to accommodate that movement. In an embodiment, either of or both actuators 441 and 444 may be connected to frame 450, but are not connected to second platform 420. Such actuators may be operable to displace the second platform 420 by extending toward the second platform 420 and pushing on the platform 420. For example, actuator 444 may be connected to frame 450, but is not connected to the second platform 420. If actuator 441 displaces the second platform 420 along the X-axis, actuator 444 does not need to stretch or shrink to accommodate that movement because actuator 444 is not connected to the second platform 420. Such an embodiment may additionally include one actuator on the opposite side of actuator 441 (to push in the opposite direction as actuator 441) and another actuator on the opposite side of actuator 444 (to push in the opposite direction of actuator 444).

Both FIGS. 5 and 6 further show that actuators 442, 443, and 445 may be arranged in a symmetrical tripod configuration, such that they are located at the vertices of an equiangular triangle (i.e., a triangle having a 60° at each corner) centered at a center of surface 421 of platform 420. This configuration reduces mechanical stress on the platform 420 and on the actuators 442, 443, and 445. The use of three actuators that are connected to platform 420 may provide more stability compared to the use of, e.g., four actuators, which may cause instability and wobbling of the platform 420 if the four actuators are sized differently along the Z-axis (i.e., do not have the same height). This disclosure does contemplate, however, other embodiments each having different numbers (e.g., two, four, five, six) of actuators connected to the second platform 420. In these embodiments, the actuators may be located at the vertices of an equiangular polygon. For example, four actuators may be located at the vertices of a rectangular or square.

As discussed above, the actuators may be controlled by a control circuit, which passes control signals to the actuators. The control circuit may be mounted on a carrier substrate (e.g., a PCB) on which the E-OTRX 122 is mounted, or may be part of E-OTRX 122. A control circuit 602 and wire or bus traces used for carrying the control signals from the circuit 602 can be seen in FIG. 6. These wire or bus traces may be located on the same surface of platform 420, different surfaces of platform 420, or embedded in an inner layer of platform 420, which may be made from an electrically insulating material.

In one example, the wire or bus traces may bring a voltage that is in a range from 0 to the supply voltage Vcc (e.g., 5 V or 3.3 V) to one side of a particular actuator. In some instances, the other side of the actuator may be connected to an electrically conductive surface that is at another voltage, such as 0 V or Vcc/2. For instance, surface 414 of the first platform 410, to which actuators 442, 443, and 445 are connected, may be electrically conductive and held at Vcc/2 by a control circuit. In some cases, surface 414 may be part of an electrically conductive layer 411 of the first platform 410, which may have another, isolator layer 412 that electrically insulates other objects such as the transceiver housing 203 from the conductive layer 411. As shown in FIG. 6, surface 433 of the second platform 430, to which actuator 446 is connected, may also be electrically conductive and held at Vcc/2. Surface 433 may be part of an electrically conductive layer 431 of the third platform 430, which may have another, isolator layer 432 that electrically insulates other objects such as the carrier substrate from the electrically conductive layer 431. Similarly, an inner surface of frame 450, to which actuators 441 and 444 are connected, may also be electrically conductive and held at Vcc/2. In some cases, frame 450 may be made from an electrically conductive material.

In an example, the actuators 441-446 may be piezoelectric actuators, which expand or contract based on a voltage difference across the piezoelectric actuator. Although the figures illustrate circular and rectangular shapes for piezoelectric actuators, any shape can be used to obtain optimal operation. For instance, a triangular form can be used in instances where an actuator is placed in proximity to a corner, so as to avoid mechanical stress. Further, other types of actuators (e.g., electroactive polymer, microelectromechanical system (MEMS)) may be used, either as an alternative to or in combination with piezoelectric actuators. In one example, the piezoelectric actuators may each have dimensions that are less than 10 mm, or less than 1 mm.

Figure 7:
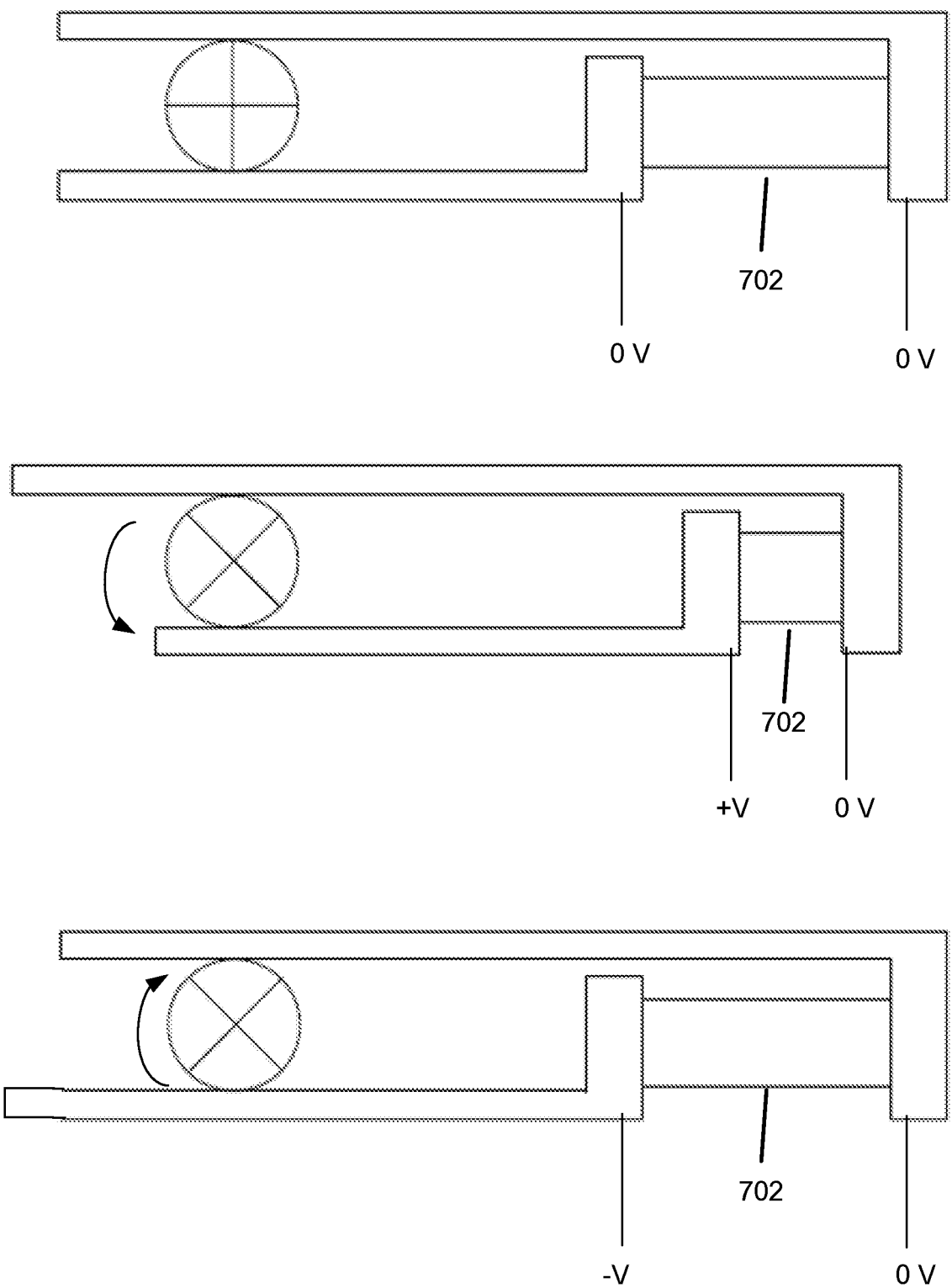
FIG. 7 illustrates the principle of operation for a piezo-electric actuator.

FIG. 7 illustrates the principle of operation of piezoelectric actuators. When there is no voltage difference across the piezoelectric actuator, the actuator is in an initial state. When a positive voltage difference is applied to the piezoelectric actuator, it may contract relative to the initial state, thus displacing an object in one direction. When a negative voltage difference is applied to the piezoelectric actuator, it may expand relative to the initial state, thus displacing the object in the opposite direction.

In some cases, it may be inconvenient or difficult to implement a control circuit that can supply a negative voltage (relative to the ground potential). In those instances, the equilibrium position of the piezoelectric actuator may correspond to Vcc/2 rather than 0 V. For example, the control circuit may bias conductive layers 411 and 431 of the first platform 410 and third platform 430, respectively, to Vcc/2. To cause motion in one direction, the control circuit may apply a voltage on the wire or bus trace that is greater than Vcc/2 (i.e., from Vcc/2 to V), because this voltage is positive with respect to the bias voltage. To cause motion in the opposite direction, the control circuit may apply a voltage less than Vcc/2 (i.e., from 0 to Vcc/2), because this voltage is negative with respect to the bias voltage.

While the above discussion relates to an E-OTRX that is configured to adjust the position of an optical transceiver 205 relative to an optical reflector embedded in a circuit board, the reflector itself may be adjustable. Thus, a circuit board may have adjustable optical transceiver, an adjustable optical reflector, or a combination thereof.

Figure 8:
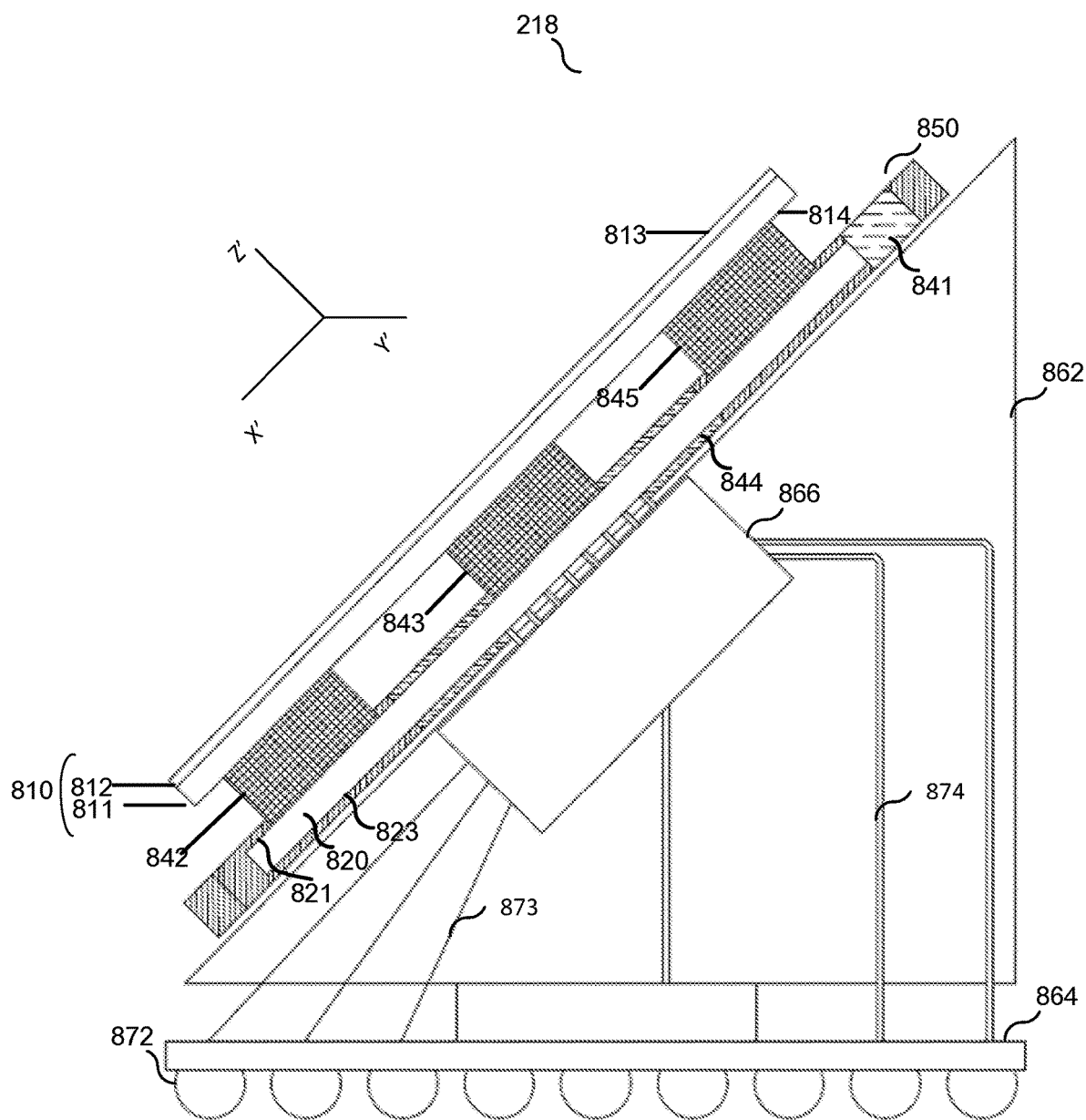
FIG. 8 illustrates a side view of a reflector that can be embedded in a circuit board.
Figure 9:
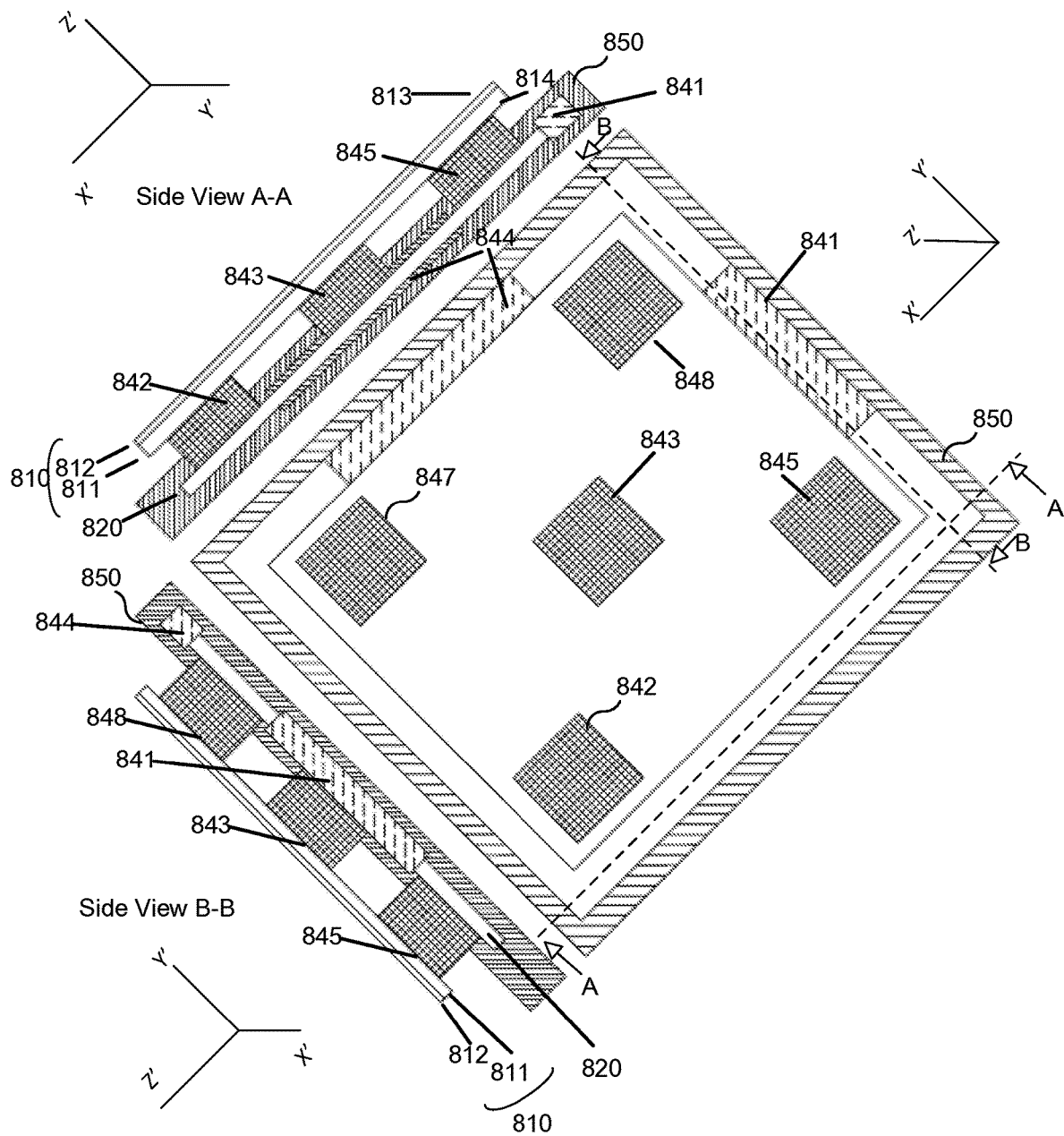
FIGS. 9-13 illustrate a plan view and side views of an apparatus for positioning a reflector in a multi-layer circuit board.

FIG. 8 illustrates a side view of an embodiment of optical reflector 218. In the embodiment shown, reflector 218 has a first platform 810, a second platform 820, and actuators 841, 842, 843, 844, and 845 for performing active alignment relative to a fixed or adjustable optical transceiver. The first platform 810 and second platform 820 are located on a triangular support structure 862 that creates an inclined surface for the reflector 218. The triangular support structure 862 may be mounted on a carrier substrate 864 (e.g., a printed circuit board (PCB) smaller than circuit board 160), which may in turn be mounted on another substrate (e.g., circuit board 160) using a mounting structure such as a ball grid array (BGA) matrix 872. The substrate 864 and BGA matrix 872 may route electrical power and control signals, such as through signal line 873 and power line 874, from a control circuit to the actuators in the optical reflector 218. The control circuit may be located in the optical reflector 218, or in another component (e.g., on circuit board 160). If the control signals are provided in a digital format, a digital to analog ASIC 866 may convert the signals to one of a series of analog voltage channels.

The first platform 810 of the adjustable optical reflector 218 has a layer 812 with a reflective surface 813 for reflecting wireless electromagnetic signals such as an infrared, visible light, or ultraviolet signal. In some embodiments, the first platform 810 is completely rigid. In other embodiments, the first platform 810 has a degree of flexibility. For instance, a flexible platform may allow the reflective surface 813 to be bent into a concave or convex shape. The actuators 841, 842, 843, 844, and 845 may be operable to displace the reflective surface 813 along the X', Y', and Z' axes shown in FIG. 8, as well as be operable to tilt and/or bend the reflective surface 813.

FIGS. 9-13 include a plan view of the second platform 820 which further shows actuators 847 and 848. Actuators 842, 843, 845, 847, and 848 may be connected to surface 814 of the first platform 810 and to surface 821 of the second platform 820. The first platform 810 and the second platform 820 may thus be connected through the actuators 842, 843, 845, 847, and 848, which are operable to move the first platform 810 relative to the second platform 820 along the Z'-axis.

More specifically, the actuators 842, 843, 845, 847, and 848 may each be operable to move along the Z'-axis, which is orthogonal to a plane parallel to the second platform 820. The actuators 842, 843, 845, 847, and 848 may all move the same distance, or may move by different distances. If the actuators 842, 843, 845, 847, and 848 move by the same distance, they may elevate or lower the first platform 810 and its reflective surface 813 relative to the second platform 820. If they move by different distances, they may tilt the reflective surface 813 on the first platform 810 relative to the second platform 820, and/or bend the reflective surface 813 on the first platform 810 into a concave or convex shape.

In an embodiment, as illustrated in FIGS. 9-13, actuator 843 may be located at a center of the surface 821 of the second platform 820. This placement facilitates bending of the first platform 810 and its reflective surface 813 into a convex or concave shape. The remaining actuators connected to the surface 821, namely actuators 842, 845, 847, and 848 may be arranged in a symmetrical configuration, such that they are located at the vertices of a square or rectangle centered at a center of platform 820. This configuration reduces mechanical stress on the platform 820 and on the actuators 842, 845, 847, and 848. While FIGS. 9-13 show five actuators on surface 821 of the second platform 820, this disclosure does contemplate other embodiments each having different numbers (e.g., two, three, four, five, six) of actuators connected to the second platform 820. In these embodiments, the actuators may be located at the vertices of an equiangular polygon. For example, three actuators may be located at the vertices of an equilateral triangle.

Actuators 841 and 844 may be attached to a frame 850 and be operable to displace the second platform 820 along axes parallel to the second platform 820, which may both be axes orthogonal to the Z'-axis. For instance, actuator 844 may be operable to displace the second platform 820 along the X'-axis, and actuator 844 may be operable to displace the second platform 820 along the Y'-axis. In an embodiment, either of or both actuators 841 and 844 may be connected to platform 820. For instance, actuator 844 may be connected to the second platform 820. In that instance, if actuator 841 displaced the second platform 820 along the X-axis, actuator 844 may be operable to stretch or shrink along the X-axis to accommodate that movement. In an embodiment, either of or both actuators 841 and 844 may be connected to frame 850, but are not connected to second platform 820. Such actuators may be operable to displace the second platform 820 by extending toward the second platform 820 and pushing on the platform 820. For example, actuator 844 may be connected to frame 850, but is not connected to the second platform 820. If actuator 841 displaces the second platform 820 along the X-axis, actuator 844 does not need to stretch or shrink to accommodate that movement because actuator 844 is not connected to the second platform 820. Such an embodiment may additionally include one actuator on the opposite side of actuator 841 (to push in the opposite direction as actuator 841) and another actuator on the opposite side of actuator 844 (to push in the opposite direction of actuator 844).

Figure 10:
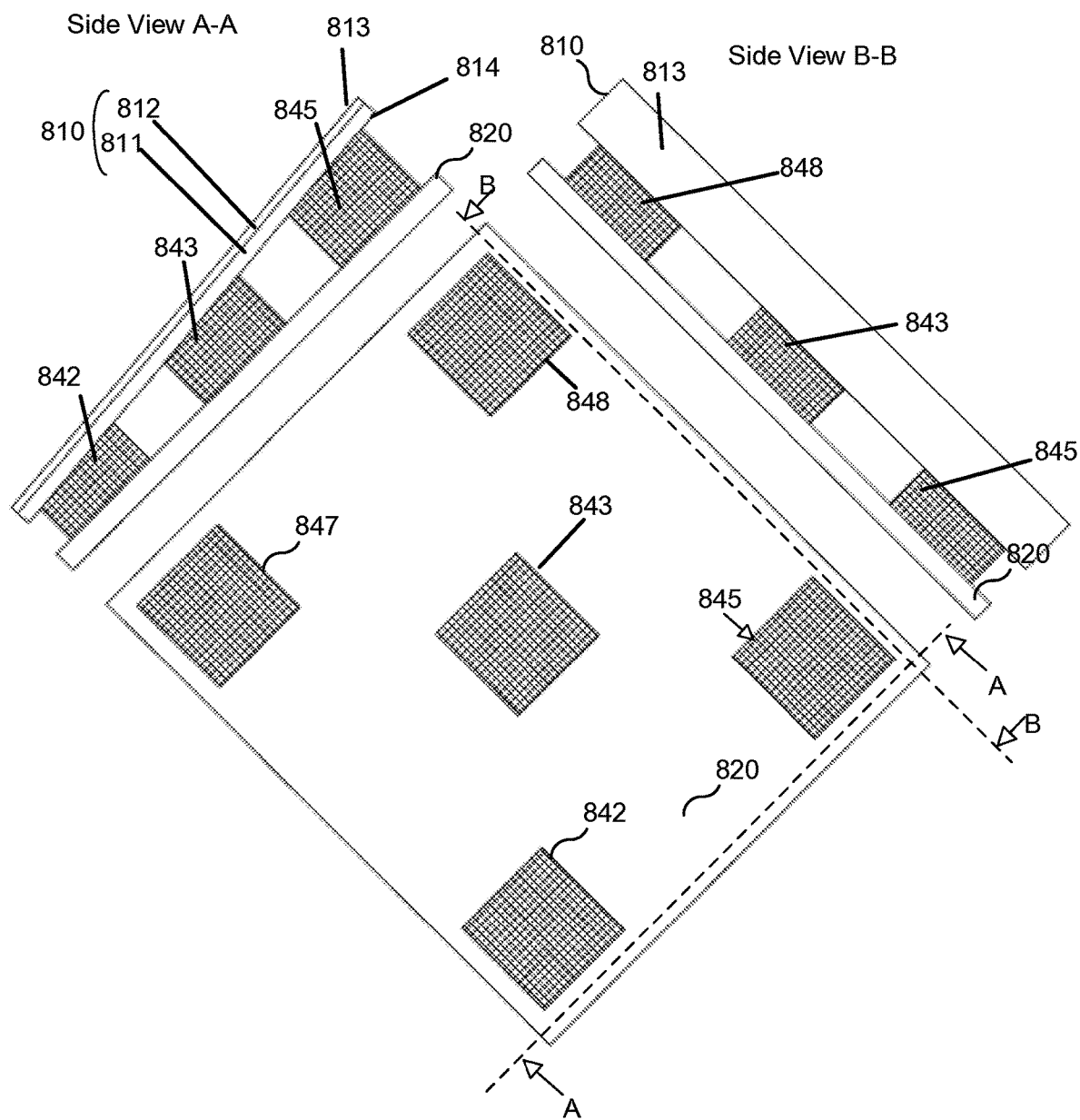

FIG. 10 illustrates the actuators 842, 843, 845, 847, and 848 in a configuration that tilts the first platform 810 and the reflective surface 813. In the side view B-B in FIG. 10, the tilted platform 810 hides actuators 848 and 845 from view.

To tilt the first platform, the actuators may be moved by respective distances along the Z'-axis such that their X', Y', and Z' coordinates fall on the same plane (e.g., such that all their coordinates would satisfy the equation aX'+bY'+cZ'=d for a set of constants a, b, c, and d). In the example shown, actuators 842 and 847 may move by a first distance along the Z'-axis, actuator 843 may move by a second distance along the Z'-axis, and actuators 845 and 848 may move by a third distance along the Z'-axis. The first distance, the second distance, and the third distance may have a linear relationship. For instance, they may be related by the formula $d_3=d_2+(d_2-d_1)$.

Figure 11A:
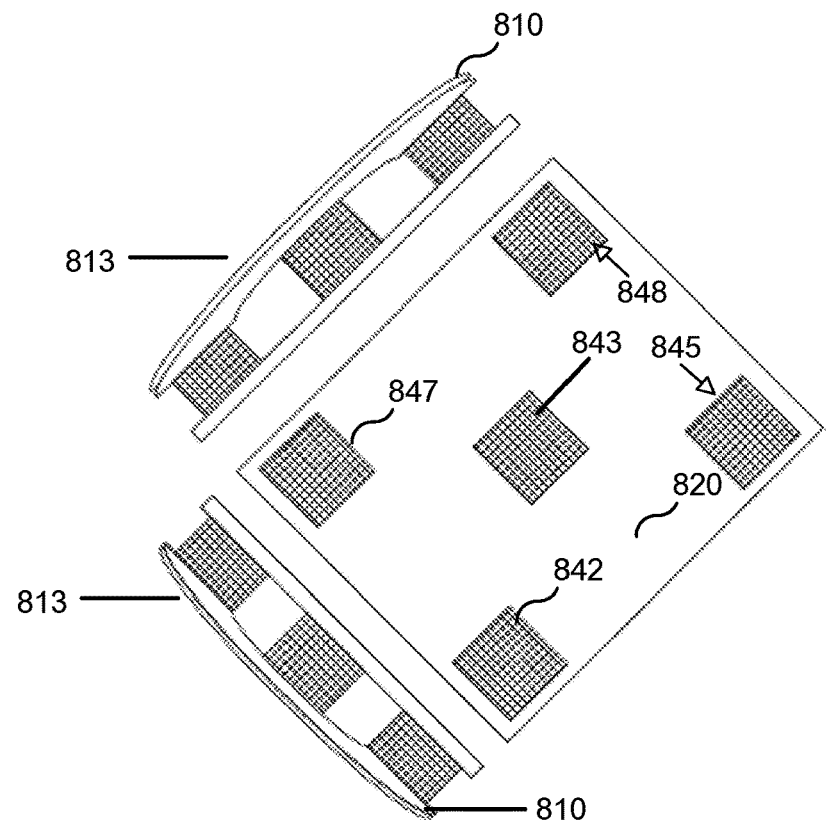
Figure 11B:
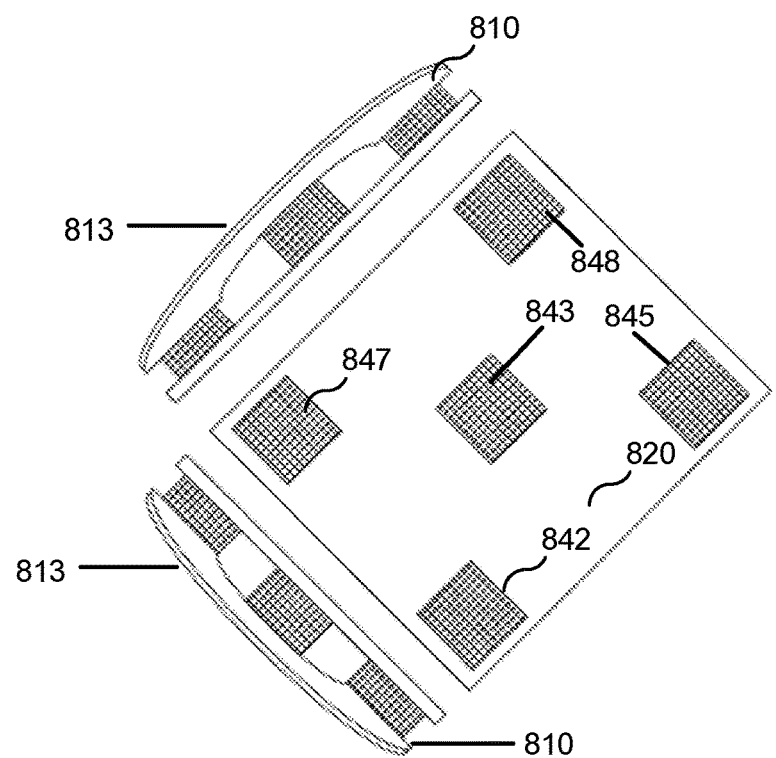

FIGS. 11A-B illustrate the actuators 842, 843, 845, 847, and 848 bending the first platform 810 and the reflective surface 813 so that it bulges outward to form a convex shape. FIG. 11A illustrates an example in which actuator 843 moves along the Z'-axis away from platform 820, while actuators 842, 845, 847, and 848 remain in an equilibrium position (e.g., at a position corresponding to a piezoelectric actuator having a voltage difference of $V_{cc}/2$ across the actuator). FIG. 11B illustrates another example in which actuator 843 remains in an equilibrium position while actuators 842, 845, 847, and 848 move along the Z'-axis to pull platform 810 toward platform 820. In some cases, actuators 842, 845, 847, and 848 may move by the same distance along the Z'-axis. In some cases, various subsets of actuators 842, 845, 847, and 848 may move by different distances along the Z'-axis (e.g., they may all move by different distances along the Z'-axis). In some cases, actuator 843 may move by a distance along the Z'-axis that is different than the distances by which all of the other actuators 842, 845, 847, and 848 are moved. In some cases, actuator 843 and a subset of actuators 842, 845, 847, and 848 may move by the same distance along the Z'-axis.

Figure 12:
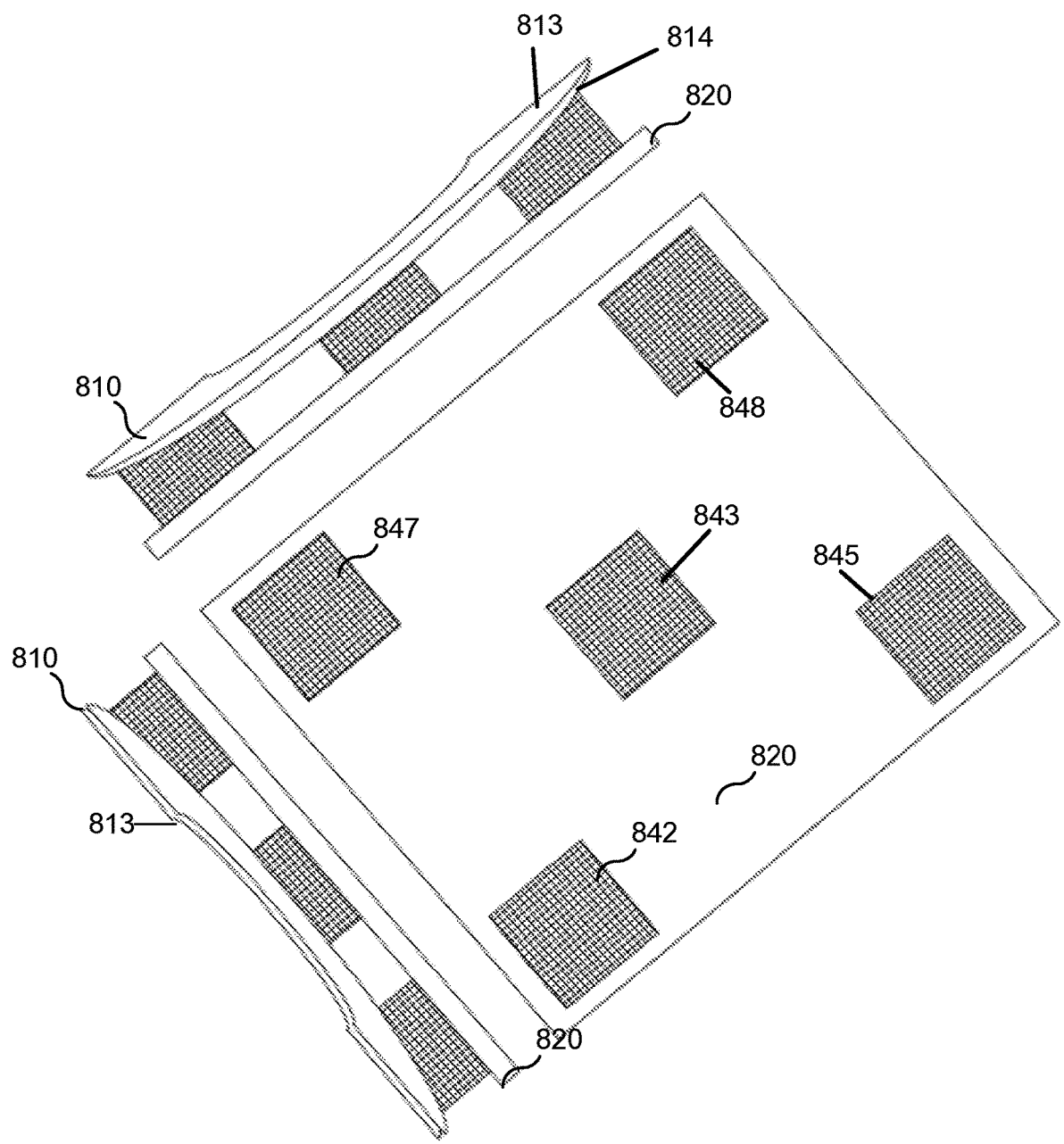

FIG. 12 illustrates an example in which actuators 842, 843, 845, 847, and 848 bend the first platform 810 and the reflective surface 813 so that it bulges inward to form a concave shape. In the example shown, actuator 843 is attached to surface 814 of the first platform 810. The actuator may move toward platform 820, and thus pull a center portion of platform 810 toward platform 820. In the example, actuators 847, 848, 842, and 845 may remain in an equilibrium position, or may move away from platform 820, and thus push edge portions of platform 810 away from platform 820. As with the examples illustrated in FIGS. 11A-11B, actuator 843 may move by a distance along the Z'-axis that is different than the distances by which all of the other actuators 842, 845, 847, and 848 are moved, or actuator 843 and a subset of actuators 842, 845, 847, and 848 may move by the same distance along the Z'-axis.

Figure 13:
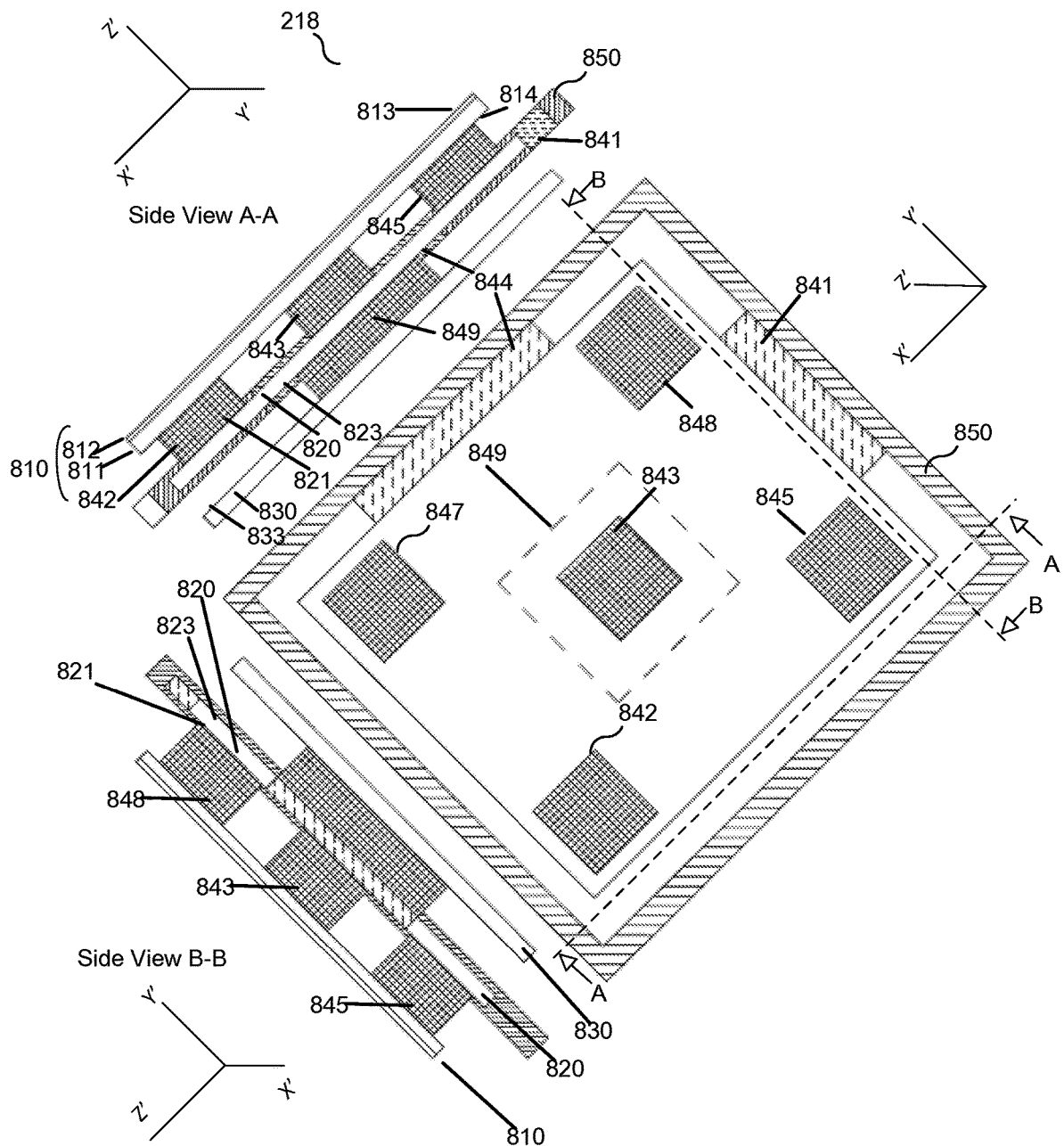

FIG. 13 illustrates an embodiment of reflector 218 that has an actuator 849 and a third platform 830. In the embodiment, the second platform 820 may be connected to the third platform 830 through actuator 849. More particularly, actuator 849 may be connected to a second surface 823 of the second platform 820 and a first surface 833 of the third platform 830. The third platform 830 may be mounted on the prism-shaped structure 862. The actuator 849 may be operable to move the second platform 820 relative to the third platform 830 along the Z'-axis. In some cases, a control circuit may rely on actuator 849 for motion along the Z'-axis, and rely on actuators 842, 843, 845, 847, and 848 primarily for tilting or bending motion. The actuators shown in the figure may all have the same size, or may have different sizes. For example, the actuator 849 may have a bigger size than each of actuators 842, 843, 845, 847, and 848 such that it can cause more displacement along the Z'-axis than each of those actuators. The actuators 842, 843, 845, 847, and 848 may be smaller in size in applications where the amount of tilting that is needed is limited in degree. Like in FIG. 6, wire or bus traces on or in platform 820 may route control signals or power to each of the actuators In an embodiment, all the actuators in FIGS. 9-13 may be piezoelectric actuators. In some implementations, a control circuit may use wire or bus traces to apply a first voltage to one portion of the piezoelectric actuators. Other portions of the reflector 218 may be electrically conductive so as to apply a second voltage to another portion of the piezoelectric actuators. For instance, surface 814 of the first platform may be electrically conductive. A control circuit may apply a second voltage of Vcc/2 to the surface 814 to bias the actuators 842, 843, 845, 847, and 848. The surface 814 may be part of an electrically conductive layer 811. As shown in FIG. 13, surface 833 may be electrically conductive so as to apply a second voltage to actuator 849, such as a bias voltage of Vcc/2. Similarly, an inner surface of frame 850 may be electrically conductive, so as to apply a second voltage to actuators 841 and 844, such as a bias voltage of Vcc/2.

Figure 14A:
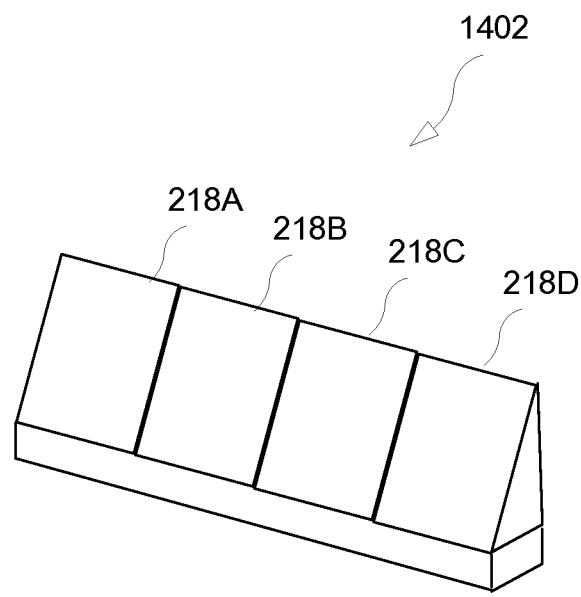
FIGS. 14A-B illustrate a perspective view and circuit diagram representation of an optical transceiver and a plurality of reflectors.

FIG. 14A illustrates an example in which four optical reflectors 218A, 218B, 218C, 218D are combined to form a trapezoid module 1402. In some embodiments, reflector 218 is replaced with trapezoid module 1402. In one example, each of the reflectors 218A, 218B, 218C, and 218D may be adjacent to a different optical fiber or other waveguide, such that the four reflectors 218A, 218B, 218C, and 218D direct an optical signal to or from four different optical fibers.

Figure 14B:
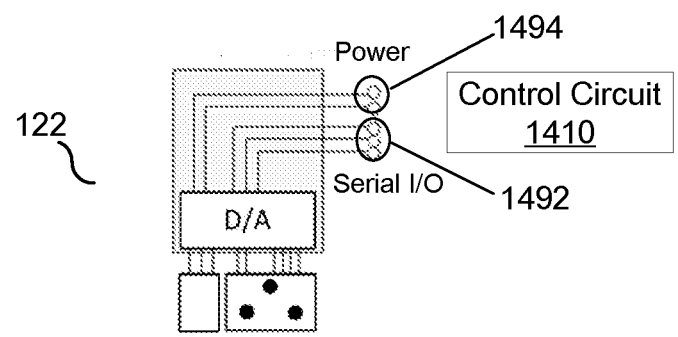
Figure 14B:
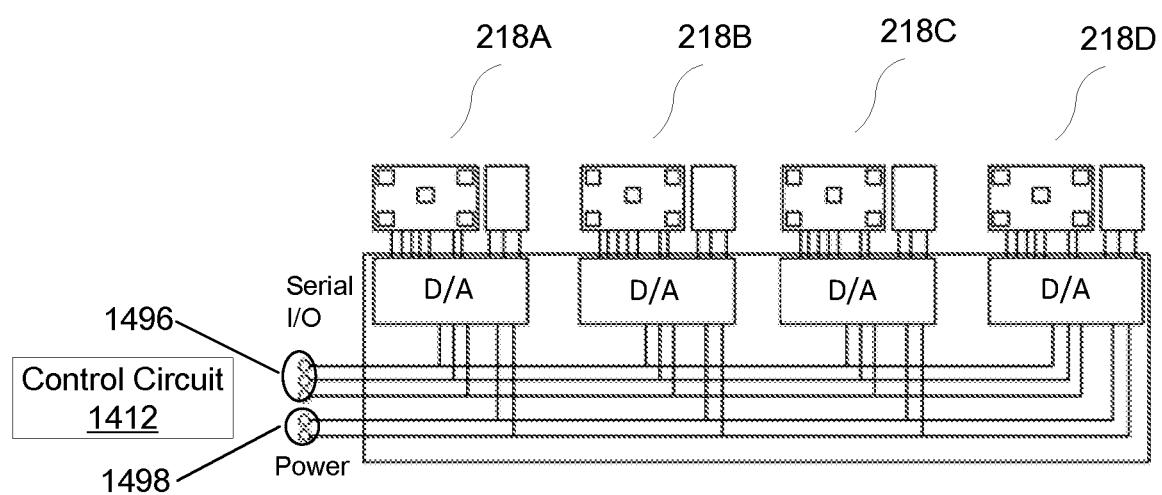

FIG. 14B shows control lines 1496 and power lines 1498 interfacing with the reflectors 218A, 218B, 218C, 218D. In some instances, these control lines 1496 and power lines 1498 may interface with one or more control circuits 1412 on circuit boards to which reflectors 218A, 218B, 218C, and 218D are mounted. The figure further shows control lines 1492 and power lines 1494 interfacing with E-OTRX 122. In some instances, the control lines 1492 and power lines 1494 may interface with one or more control circuits 1410 on a circuit board to which E-OTRX 122 is mounted. In some instances, the control lines 1492 and/or control circuit 1410 may be part of E-OTRX 122, and control lines 1496 and/or control circuit 1412 may be part of a reflector. The control lines may be used to, for example, select a particular one of the actuators and indicate, in digital format, a voltage to apply to the actuator. A digital-to-analog circuit may convert the signal to an analog voltage that is applied to the selected actuator.

The control circuits 1410, 1412 may each include a data processing system, which may include one or more processors (e.g., microprocessors) and/or one or more circuits, such as an application specific integrated circuit (ASIC) or Field-programmable gate arrays (FPGAs), etc.; a data storage system, which may include one or more computer-readable data storage mediums, such as non-transitory data storage apparatuses (e.g., hard drive, flash memory, optical disk, etc.) and/or volatile storage apparatuses (e.g., dynamic random access memory (DRAM)). In embodiments where data processing system includes a processor (e.g., a microprocessor), a computer program product may be provided, which computer program product includes: computer readable program code (e.g., instructions), which implements a computer program, stored on a computer readable medium of data storage system, such as, but not limited to, magnetic media (e.g., a hard disk), optical media (e.g., a DVD), memory devices (e.g., random access memory), etc. In some embodiments, computer readable program code is configured such that, when executed by data processing system, code causes the data processing system to perform steps described herein. In some embodiments, the control circuit may be configured to perform steps described above without the need for code. For example, data processing system may consist merely of specialized hardware, such as one or more application-specific integrated circuits (ASICs). Hence, the features of the control circuit described above may be implemented in hardware and/or software.

While various aspects and embodiments of the present disclosure have been described above, it should be understood that they have been presented by way of example only, and not limitation. Thus, the breadth and scope of the present disclosure should not be limited by any of the above-described exemplary embodiments. Moreover, any combination of the elements described in this disclosure in all possible variations thereof is encompassed by the disclosure unless otherwise indicated herein or otherwise clearly contradicted by context.

Additionally, while the processes described herein and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

The invention claimed is:

1. A system for communicating optical signals, comprising:
    a first embedded optical transceiver system (E-OTRX) configured to transmit a first beam of light in a first direction, the first E-OTRX comprising a first optical transceiver configured to produce the first beam of light or produce a second beam of light from which the first beam of light is formed;
    a second E-OTRX having a second optical transceiver configured to receive light;
    a multilayer printed circuit board (PCB) attached to the first E-OTRX and the second E-OTRX, the multilayer PCB comprising:
        a first opening facing the first E-OTRX and a second opening facing the second E-OTRX, and the multilayer PCB further comprising:
        a first layer;
        a second layer;
        a transparent layer between the first layer and the second layer, the transparent layer comprising a first compartment;
        a first mirror disposed in the first compartment of the transparent layer and in the first opening of the multilayer PCB; and
        a second mirror disposed in the first compartment of the transparent layer and in the second opening of the multilayer PCB, wherein
    the first mirror is operable to reflect the first beam of light or the second beam of light into the transparent layer in a plurality of directions angled with respect to the first direction, thereby being operable to produce a first reflected beam of light travelling in a second direction and a second reflected beam of light travelling in a third direction, which is different than the second direction,
    the second mirror is positioned such that the second mirror is able to reflect the first reflected beam of light toward the second E-OTRX,
    the first E-OTRX further comprises one or more actuators that are operable to move the first optical transceiver of the first E-OTRX relative to the first mirror.

2. The system of claim 1, wherein
the transparent layer of the multilayer PCB further comprises a second compartment, and
the first compartment and the second compartment are separated from each other by a non-transparent isolating structure such that light in the first compartment cannot reach the second compartment.

3. The system of claim 1, wherein
the first E-OTRX is configured to transmit the first beam of light at a first frequency, and
the system further comprises a third optical transceiver configured to transmit another beam of light in the first direction at a different frequency than the first frequency.

4. The system of claim 3, wherein the multilayer PCB further comprises a third mirror operable to reflect a beam of light corresponding to said another beam of light transmitted from the third optical transceiver.

5. The system of claim 1, wherein
the system further comprises one or more actuators that are configured to move the first mirror relative to the first optical transceiver of the first E-OTRX.

6. The system of claim 5, wherein
the first optical transceiver produces the second beam of light from which the first beam of light is formed, and
the first E-OTRX further comprises: i) a beam expander configured to produce the first beam of light by expanding the second beam of light and ii) a housing that houses the first optical transceiver and the beam expander.

7. The system of claim 1, wherein each of the first mirror and the second mirror is a cone mirror.

8. The system of claim 1, wherein the second E-OTRX further comprises a lens system configured to narrow a beam of light and to pass the narrowed beam of light to the second optical transceiver of the second E-OTRX, and a housing that houses the second optical transceiver and the lens system.

9. The system of claim 1, wherein
the first E-OTRX comprises a first platform and a second platform,
the first platform is coupled to the first optical transceiver of the first E-OTRX,
said one or more actuators are disposed between the first platform and the second platform, and
said one or more actuators are configured to move the first optical transceiver of the first E-OTRX by changing a distance between the first platform and the second platform.

10. The system of claim 1, wherein said one or more actuators are configured to expand or contract based on signals applied to said one or more actuators and to move the first optical transceiver of the first E-OTRX based on expansion or contraction of said one or more actuators.

11. The system of claim 1, wherein
said one or more actuators comprises a first group of one or more actuators and a second group of one or more actuators,
the first group of actuators is operable to move the first optical transceiver of the first E-OTRX in the first direction, and
the second group of actuators is configured to move the first optical transceiver of the second E-OTRX in a direction angled with respect to the first direction.

12. The system of claim 1, wherein
the first E-OTRX is configured to produce the first beam of light or the second beam of light at a first wavelength,
a third E-OTRX is configured to produce a third beam of light at a second wavelength, and
the first wavelength and the second wavelength are different.

13. The system of claim 12, wherein
the first E-OTRX is configured to produce the first beam of light or the second beam of light at a timing, and
the third E-OTRX is configured to produce the third beam of light at the timing.

14. The system of claim 1, wherein
the first E-OTRX is configured to produce the first beam of light or the second beam of light at a wavelength, and
a third E-OTRX is configured to produce a third beam of light at the wavelength.

15. The system of claim 14, wherein
the first E-OTRX is configured to produce the first beam of light or the second beam of light at a first timing, and
the third E-OTRX is configured to produce the third beam of light at a second timing different from the first timing.

16. The system of claim 1, further comprising a rod configured to guide the first beam of light or the second beam of light toward the first mirror.

* * * * *